United States Patent [19]

Wu

[11] Patent Number: 5,256,204
[45] Date of Patent: Oct. 26, 1993

[54] SINGLE SEMICONDUCTOR WATER TRANSFER METHOD AND MANUFACTURING SYSTEM

[75] Inventor: Hong J. Wu, Hsin, Taiwan

[73] Assignee: United Microelectronics Corporation, Hsinchu, Taiwan

[21] Appl. No.: 806,632

[22] Filed: Dec. 13, 1991

[51] Int. Cl.5 .................. H01L 21/00; H01L 21/02; C23C 16/00
[52] U.S. Cl. .................. 118/719; 118/729; 29/25.01
[58] Field of Search .................. 118/715, 719, 729

[56] References Cited

U.S. PATENT DOCUMENTS

| | | | |
|---|---|---|---|
| 3,845,286 | 10/1974 | Aronstein et al. | 118/719 |
| 4,532,970 | 8/1985 | Tullis et al. | 141/98 |
| 4,534,389 | 8/1985 | Tullis | 141/98 |
| 4,540,326 | 9/1985 | Southworth et al. | 414/217 |

Primary Examiner—Brian E. Hearn
Assistant Examiner—B. Everhart
Attorney, Agent, or Firm—George O. Saile

[57] ABSTRACT

A manufacturing system for processing semiconductor wafers through a plurality of processing stations that perform manufacturing operations on wafers includes a plurality of processing stations, each of which are capable of performing at least one processing operation of a wafer, each of the processing stations having a controlled environment for processing the wafers, and a branched track providing a surface leading to each of said processing stations. On the track there are provided a plurality of guided transport vehicles adapted to travel between the process stations. A plurality of wafer carriers, each adapted to support a single wafer and be carried by the transport vehicles, are part of the system. An interface is provided at each processing station to introduce the wafer from the box into the clean environment of the process station, and subsequently return the box and wafer to the transport vehicle.

24 Claims, 19 Drawing Sheets

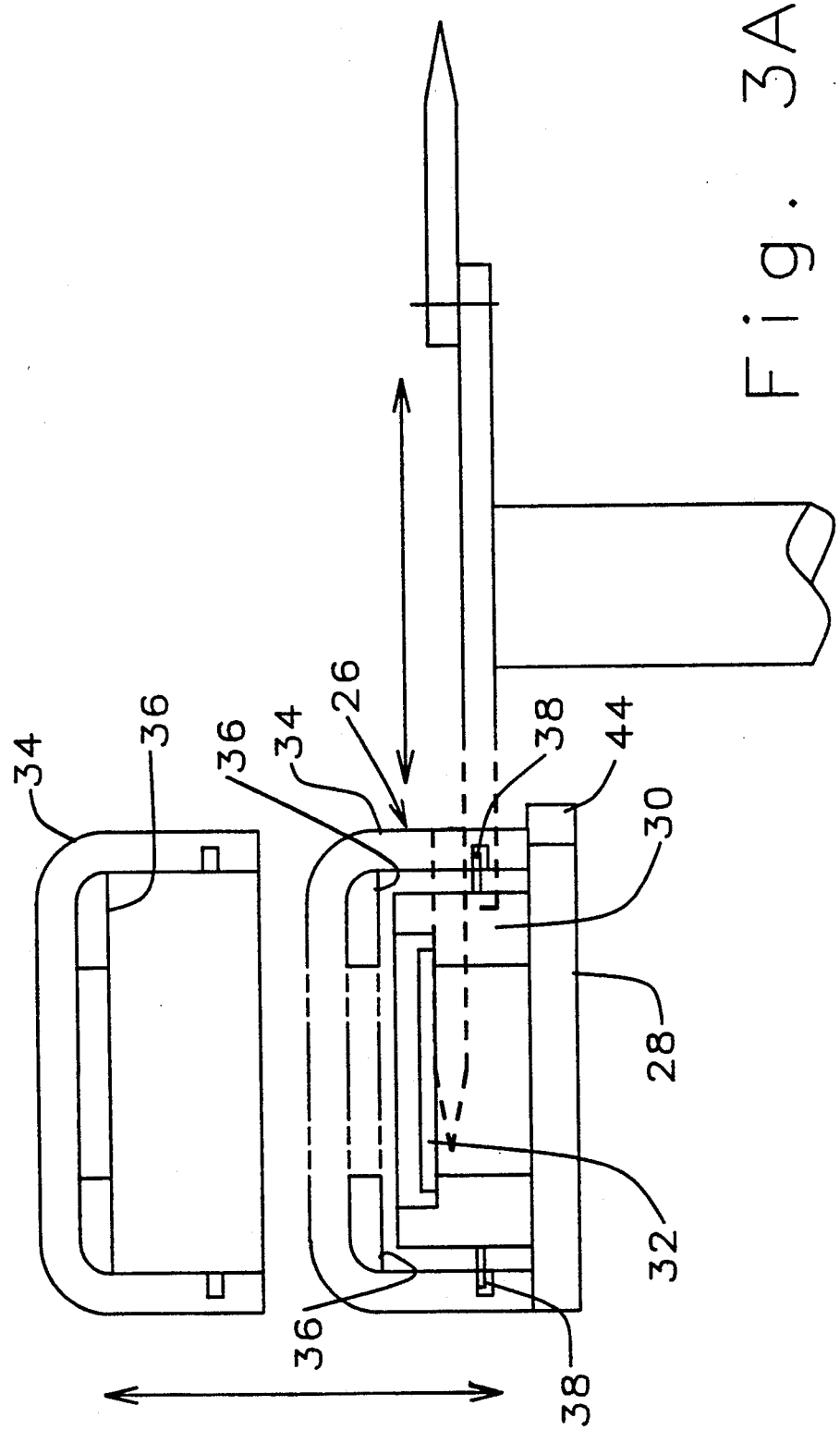

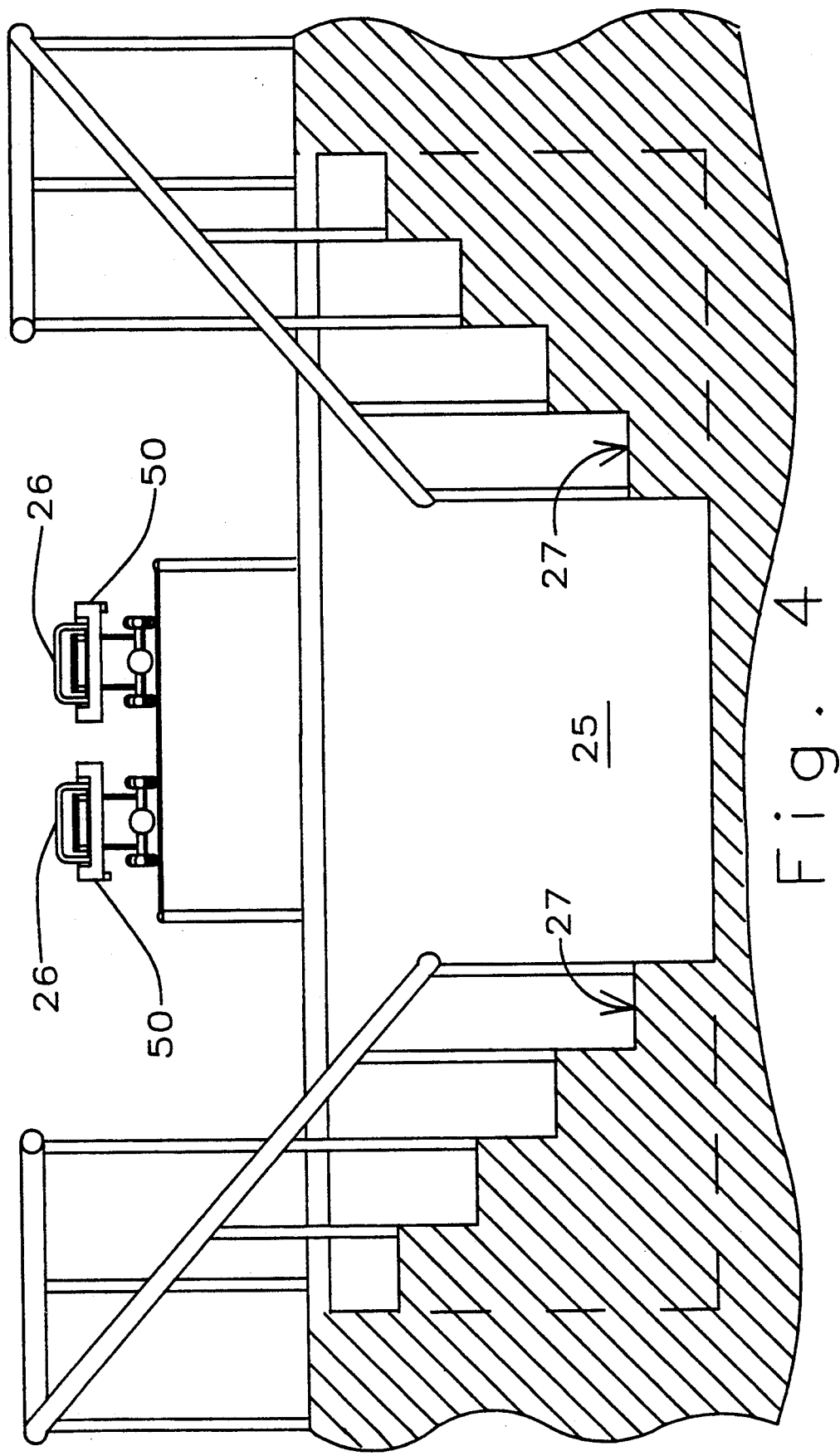

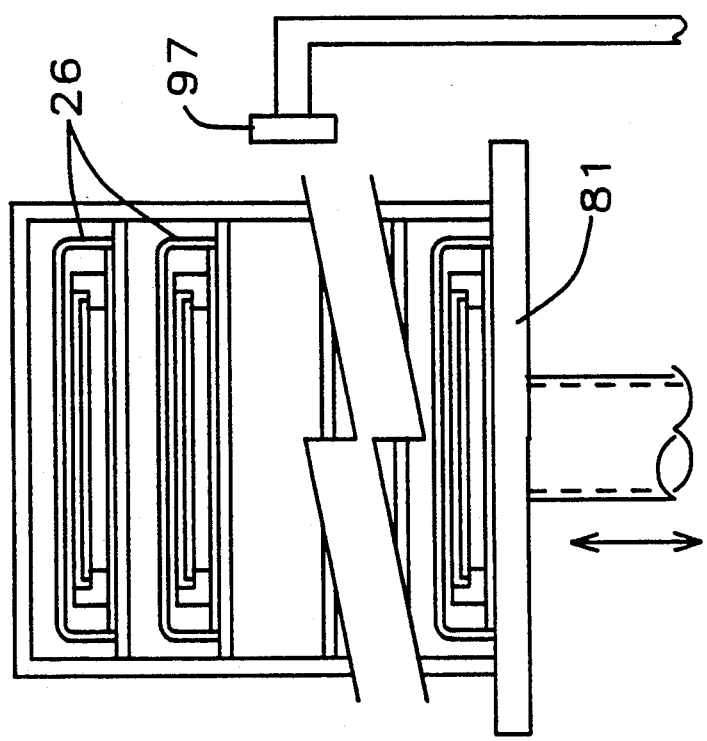
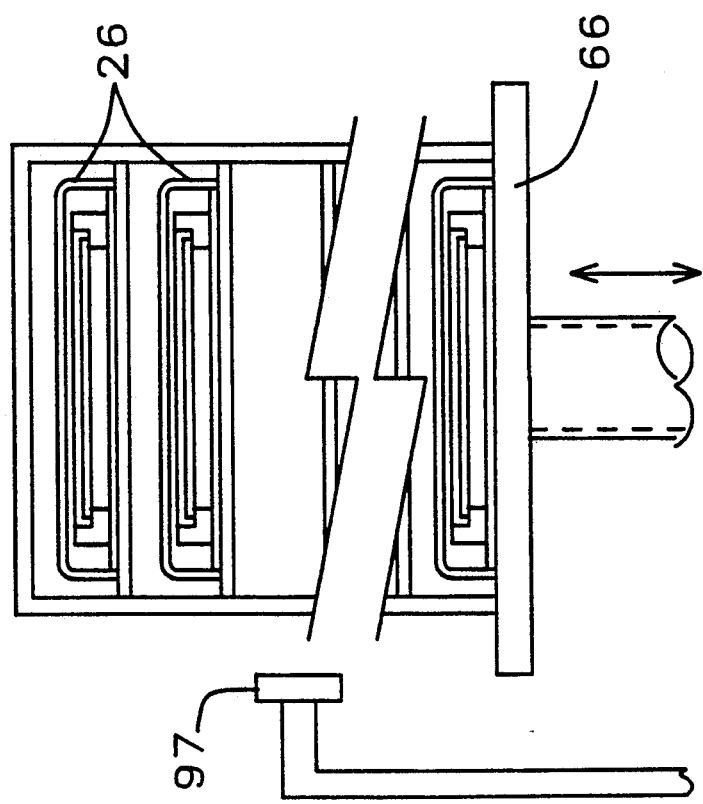
Fig. 10

SINGLE SEMICONDUCTOR WATER TRANSFER METHOD AND MANUFACTURING SYSTEM

BACKGROUND OF THE INVENTION (1) Field of the Invention

The present invention relates in general to automated manufacturing of integrated circuit semiconductor devices, and more particularly to a system where each wafer is handled as a single unit, as contrasted to the more conventional batch processing. This single unit handling method and system can result in faster cycle time, better prevention of particulate contamination and easier to automate mechanisms.

(2) Description of the Prior Art

In the manufacture of semiconductor devices, a circular monocrystalline semiconductor wafer, most typically of monocrystalline silicon, is subjected to a large number of processes steps. These process steps include oxidation of the surface to form silicon dioxide insulating layers, deposition of polycrystalline silicon and/or metallic layers, diffusion and/or ion implantation of dopants into selected areas, lithography/masking/etching operations, etching of the various layers mentioned above, heat treating and other steps that are well known to those skilled in the art. A multitude of extremely small and complex electrical circuits are thus formed on the semiconductor wafer through these process steps. As the technology has progressed, the wafers have been made larger and the feature size of the elements of the circuitry on the wafer's surface have been greatly decreased. This progress has also lead to greater numbers of devices that have increasingly faster circuits manufacturable on the wafer.

As the size of the circuitry has decreased, airborne contamination becomes responsible for a serious yield problem. Since the integrated circuitry formed upon the silicon wafer is extremely small with feature size in the order of near micrometer or even submicrometer, it only takes a very small sized particle to either short circuit or cause an open in the formed circuitry. Also, such a particle can block processing chemicals from reaching every portion of the circuitry on the wafer during critical processing steps. Some contamination particles can cause incomplete etching in spaces between lines, thus leading to an unwanted electrical bridge. In addition to such physical defects, other contamination particles may cause electrical failure due to induced ionization or trapping centers in gate dielectrics or the like.

The main sources of particulate contamination are manufacturing line workers, equipment, and chemicals. Particles given off by workers in the area are transmitted through the environment, and through physical contact or migration onto the wafer surfaces. People, by shedding of skin flakes, for example are a significant source of particles that are easily ionized and cause defects. It has been found that as many as 6000 particles per minute are emitted into an adjacent cubic foot of space by a fully suited operator.

An early effort to overcome the contamination problem was to process semiconductor devices in clean rooms with HEPA or ULPA recirculating air systems with suited operators. This procedure is, however quite expensive and not always effective particularly in the era of submicrometer feature size that we are now entering. Although clean room garments reduce particle emissions they do not fully contain the emissions. Also, it is inconvenient and uncomfortable to the operators to remain fully suited at their work throughout the entire work shift.

Movement of semiconductor wafers through the fabrication system for integrated semiconductor devices have long used a cassette system to handle wafers. The wafers are carried in cassettes from processing machine to processing machine. There are many wafers in each cassette. Typical wafer cassettes are manufactured and sold by Fluoroware, Inc. of North Chaska, Minnesota USA.

The disadvantages of the cassette system are that the wafers are batch processed, since the cassette is designed to hold many wafers. The cycle time for each wafers then becomes long. This adds to the cost, since a greater inventory is tied up for a longer time. Also, the response time to meet varying customer requirements is long. In addition, the friction between the wafer and the cassette can create particles when the wafers are loaded and unloaded. This contamination occurs in the clean environment and remains there. Still further, the batch transportation of wafers in a cassette or carrier opens the entire batch of wafers to damage from shock loads.

A more recent innovation in cassette systems useful in reducing the effects of contamination is the Standard Mechanical Interface (SMIF) system which is based on the realization that a small volume of still particulate-free air, with no internal source of particles is the cleanest possible environment for silicon wafer processing. A SMIF has been proposed by the Hewlett-Packard Company and is described in U.S. Pat. Nos. 4,532,970 and 4,534,389. The SMIF system consists of two parts, that is (1) a controlled environment including a clean process environment canopy surrounding a wafer-handling mechanism of each processing machine, and (2) a small clean box having a quiet internal environment for carrying a number of wafers from processing machine to another processing machine. Basically, the clean environment is maintained in the process station and in the box or cassette for carrying wafers. The wafers, contained in the cassette are introduced into the clean environment surrounding the machine through an air lock, processed in the processing machine, placed back in the cassette, and withdrawn through another air lock. The wafers are then moved to another processing machine for the next process by the same procedure.

The problems inherent in the SMIF system are those that were described about for the cassette system, since SMIF is inferentially a cassette system. The further problems involve the mechanization difficulties in moving the wafers from the SMIF cassette pod to the processing machines.

The U.S. Pat. No. 4,540,326 discloses a system for transporting wafers between processing stations through a tunnel where a clean environment is maintained. However, the wafers are loaded and unloaded into a cassette mounted on a cart. The system, however is a batch operation with the aforedescribed disadvantages. Further, the system is inflexible, that is not capable of simultaneously processing wafers requiring different types of processing. Complete fabrication of single wafer transfer using prior art will be very rigid and loses all flexibility.

A very recent improvement in automated semiconductor manufacturing lines is described in commonly assigned application Ser. No. 07/628,437, filed Dec. 17, 1990. The automated manufacturing lines process a single wafer through a plurality of processing stations. Branched tunnels are connected to the processing stations and a controlled environment is maintained in both the tunnels and the processing stations. Canopies are provided over the processing apparatus at each station to maintain a very clean environment. The semiconductor wafers are each supported on a tray which is transported from station to station, through the tunnels, on automated transport vehicles, until the processing is completed. At each station, automated robots are provided to unload the tray and wafer from the vehicles, load and unload the wafer from the tray, and place it in the appropriate processing apparatus for processing. The disadvantages of the system are that (1) clean air must be maintained in the tunnel and (2) modifications to the system are complicated by tunnel rearrangements.

The U.S. Pat. No. 3,845,286 describes a wafer processing system wherein single wafers are transported to various processing stations with a transport mechanism. While the concept of individual wafer processing is disclosed, the problems concerning contamination are not addressed. These problems would be substantial in the environment described in this processing system.

The U.S. Pat. No. 4,027,246 also discloses a wafer processing system where semiconductor wafers are individually transported between processing stations. The wafers are transported between processing stations by use of an air track, which in modern manufacturing technology would be unacceptable, because of a lack of adequate contamination prevention control.

SUMMARY OF THE INVENTION

It is a primary object of the present invention to provide a single wafer transfer system and method using a very flexible vehicle single wafer transfer between single wafer processing stations.

It is a further object of this invention to provide a system and method for transferring single wafers through each of their fabrication sequences to result in faster cycle time, better prevention of particulate contamination and easier mechanical movement between processing machines.

It is a still further object of the present invention to provide an improved semiconductor wafer processing system that controls contamination in the working environment.

Yet another object of the present invention is to provide a semiconductor wafer processing system which is less abrasive to the wafers during processing, thereby reducing contamination from abraded particles and also reducing the potential damage to the wafers due to shock and vibration.

The manufacturing system of the invention for processing semiconductor wafers through a plurality of processing stations that perform manufacturing operations on wafers includes a plurality of processing stations, each of which are capable of performing at least one processing operation on a wafer, each of the processing stations having a controlled environment for processing the wafers, and a branched open track between the processing stations. For operation of the track, there are provided a plurality of guided transport vehicles adapted to travel between the process stations. A plurality of sealed wafer boxes or capsules, each adapted to support a single wafer and be carried by the transport vehicles, are part of the system of the invention. At each station, a suitable means is provided to transfer the wafer from the box to the environment surrounding the processing apparatus, and return the wafer to the sealed box after processing is completed. A wafer will remain with the same box carrier throughout its processing, although the wafer will be lifted from the carrier for processing at the processing stations. The wafers being processed are contained at all times either in the controlled clean environment at the processing stations, or in the sealed stagnant air environment within the box.

In the method of the invention of manufacturing semiconductor devices on a production line having (a) a plurality of semiconductor wafer processing stations, (b) an open track structure between the processing stations, (c) a guided transport vehicle adapted to operate on the track, between processing stations, (d) a plurality of wafer boxes to accept a single wafer, each provided with a cover, an information storage memory to accept a wafer process step sequence, (e) means to maintain a clean environment surrounding the processing stations, (f) means at each processing station for transferring the wafer from the box to the environment surrounding the processing apparatus, and returning the wafer to the sealed box after processing is completed, (g) a computer system to guide the transport vehicles on the track, transfer wafers at the processing stations, in response to information in the wafer carrier memory, the method includes the steps of (1) loading a process sequence into the wafer box memory, and a wafer into the box, (2) loading the box onto a transport vehicle, (3) moving the transport vehicle to a processing station in response to information contained in the process sequence stored in the wafer carrier memory, (4) transferring the wafer at the designated processing station, (5) performing the indicated process on the wafer at the processing station, (6) altering the process sequence to indicate that the process step has been completed, (7) returning the wafer to the box and placing the box onto a transport vehicle, (8) moving the transport vehicle to the next processing station in response to the altered process sequence, and (9) repeating the forgoing method steps until the process sequence in the wafer carrier memory is complete.

Additional objects and features of the invention will appear from the following description in which the preferred embodiments of the invention have been set forth in detail in conjunction with the drawings.

BRIEF DESCRIPTION OF THE DRAWINGS

The drawings show the following.

FIG. 3A is a side view of a preferred embodiment of a wafer box for use in the manufacturing system of the invention.

FIG. 4 is an elevational view showing a track cross section and a pair of transport vehicles thereon.

FIG. 10 is a view taken on line 10—10 of FIG. 2.

DESCRIPTION OF THE PREFERRED EMBODIMENTS

Figure 1A:
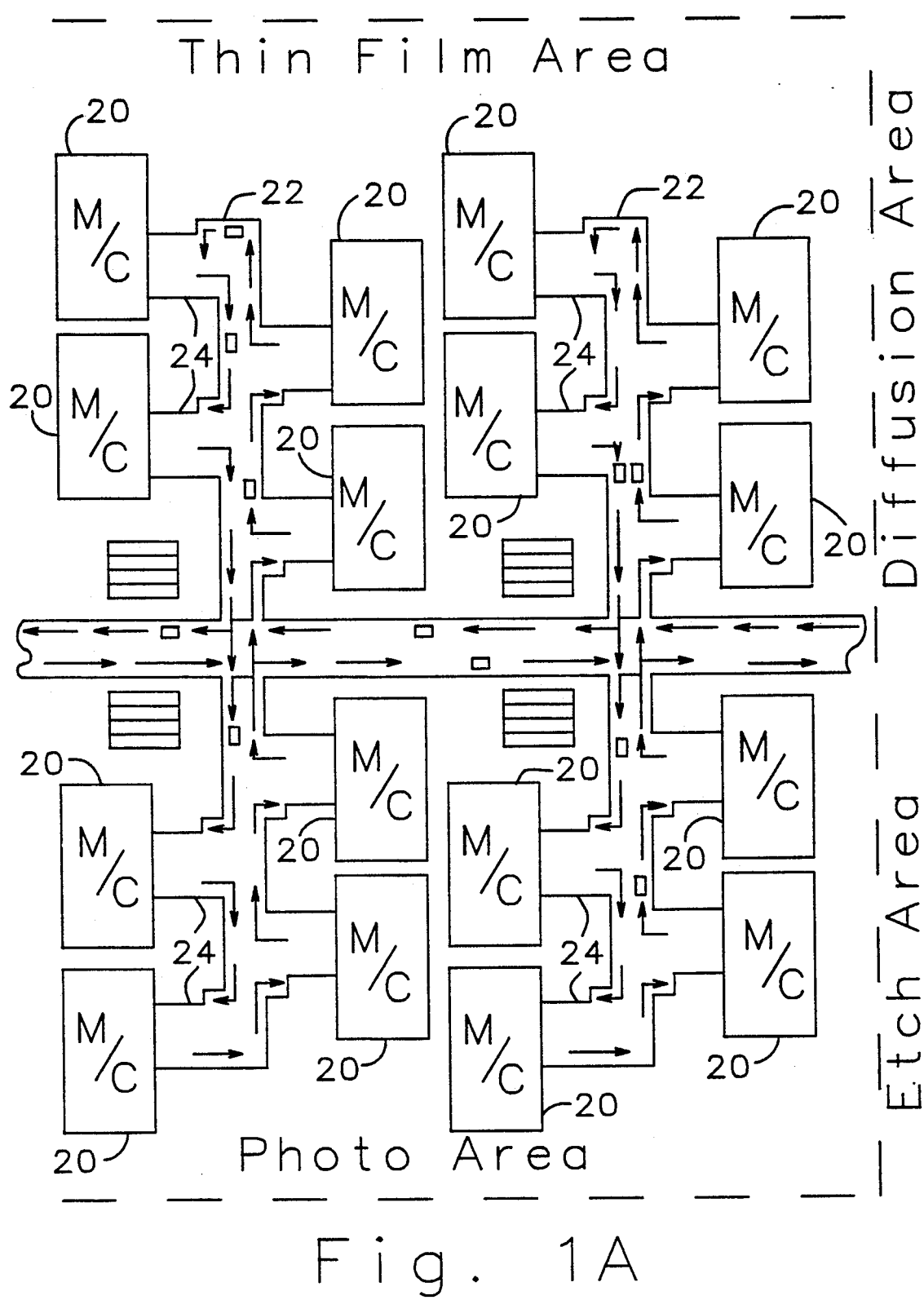
FIGS. 1A and 1B are is a diagrammatic representations in plan view which together depict a manufacturing system embodying the principles of the invention of this application.

Referring now to the Figures of the drawing, and to FIGS. 1A and 2B in particular there is illustrated a diagrammatic plan view of the manufacturing system of the invention. The system has a series of processing stations 20 for performing the various manufacturing operations on semiconductor wafers. The fabrication of typical semiconductor integrated circuits today may include a process sequence of 200 or more process steps using 50 or more work stations and hundreds of pieces of equipment. The work stations 20 could include the following machine types: lithography masking, silicon oxide furnace, diffusion furnace, ion implanter, wet-etcher, dry etcher, epitaxy, chemical vapor deposition, sputter deposition, prober, inspection machines, rapid thermal anneal and the like, all of which are known to the prior art.

The organization of these processing or work stations 20 groups them in four major Areas, that is the Thin Film Area, the Photo or Lithography Area, Diffusion and Ion Implant Area, and the Etch Area. The purpose of this grouping is convenience for operation, observation and maintenance. The manufacturing operations do not need manual handling or push buttons, but need constant observation for the development of special situations and maintenance. People assigned for these jobs are divided into four groups by the mentioned specialties. Therefore, each group of operations is better confined in closer locations for the convenience of the assigned people. Each of the processing station 20 has its own special a controlled environment for processing wafers within its structure.

A track 22 with branches 24 are connected to the processing stations 20 and provides a platform between the stations. Preferably an access tunnel 25 is provided beneath track 22 for servicing, as indicated more clearly in FIG. 4. Access to tunnel 26 is by stairways 27.

Each of the processing stations 20 includes a process apparatus and a canopy or self-contained enclosure that encloses the apparatus. A very clean environment, which may be for example clean air or inert gas like nitrogen, is maintained within the canopy or enclosure by techniques and apparatus known in the art. A clean environment is maintained in the particular processing equipment as needed by that piece of equipment and would normally be included with the equipment. However, should the processing equipment not have its own clean environment to open the wafer box, the environment can be preferably maintained by providing a constant laminer flow of air/inert atmosphere from the ceiling to the floor that is filtered. Preferably air/inert atmosphere is exhausted through an exhaust duct located in the floor. A filter is a laminar flow ULPA filter capable of removing 0.05 micron particulates to 99.9995%. This removal of particles brings the canopy environment to the highest possible clean room class. The US Federal Standard No. 209 d maintains the definition of the Classes from Class 100,000 down to Class 1 if that could be attainable. The canopy is or enclosure preferably Class 1 with less than 0.1 micron particle size. Filters that are capable of such operation are made by Air Tech Japan, LTD. of Tokyo 110, Japan; Flanders Filter, Inc. of Washington, North Carolina, USA, and Cambridge Filter Corporation of New York, N.Y. USA. The clean air/inert atmosphere environment can be maintained in the controlled environment portion of each of the processing stations 20 as is required to accomplish the desired results in that particular processing station.

Figure 3B:
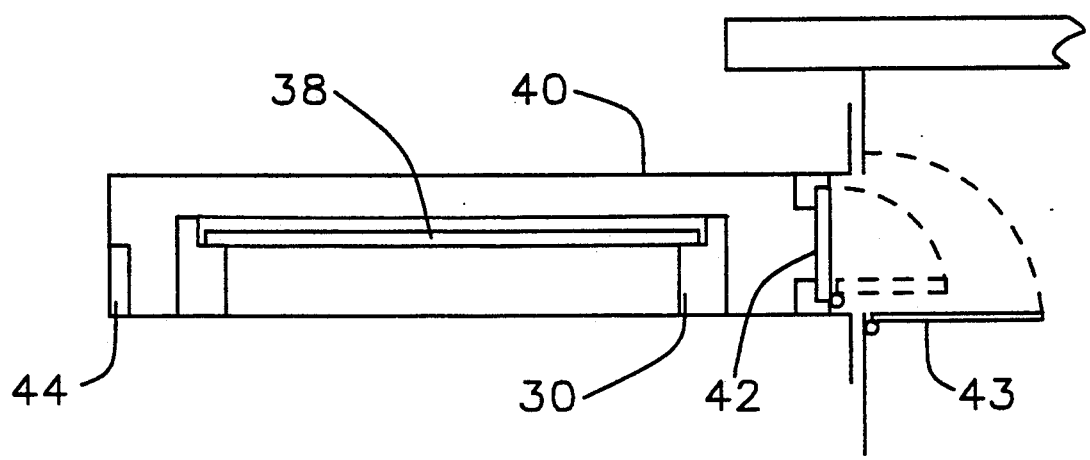
FIG. 3B is an elevational view of an alternate embodiment of a sealed box and a structure for the transferring the wafer into the canopy surrounding the processing apparatus.

The wafers are moved between processing stations 20 in sealed capsules, or boxes 26, as shown in FIG. 3A. The boxes each hold a single semiconductor wafer. Each box 26 has a base 28, a platform 30, on the base 28 that supports a wafer 32 on its peripheral edge surface, and a cover 34 that encloses the wafer. Preferably the cover 34 has a shoulder 36 that holds the wafer in position over the platform. A lock pin 38 is provided to secure the cover 34 to base 28. A radial slot in the wall of platform 30 is provided, as more clearly shown in FIG. 3B, to permit entry of a lifting means beneath the wafer. This will facilitate unloading of the wafer 32 from the box 26.

In operation the wafer, during transport between stations is contained in box 26 and is exposed to the stagnant atmosphere in the box. This atmosphere is maintained relatively dust free, since it is only in contact with the atmosphere in the canopies enclosing the various process apparatus as will be explained.

At the process stations the boxes containing a single wafer will be either moved inside the canopy through a suitable air lock, or through an entry door where the pressure within the canopy is slightly higher than the outside atmosphere. After the box is in the canopy, the cover can be removed and the wafer taken out and processed. After processing, the wafer is placed back in the box, by automated apparatus within the canopy, the cover placed on the base, and the box taken out of the canopy through a air lock, or door, for transport to the next processing station.

Figure 3C:
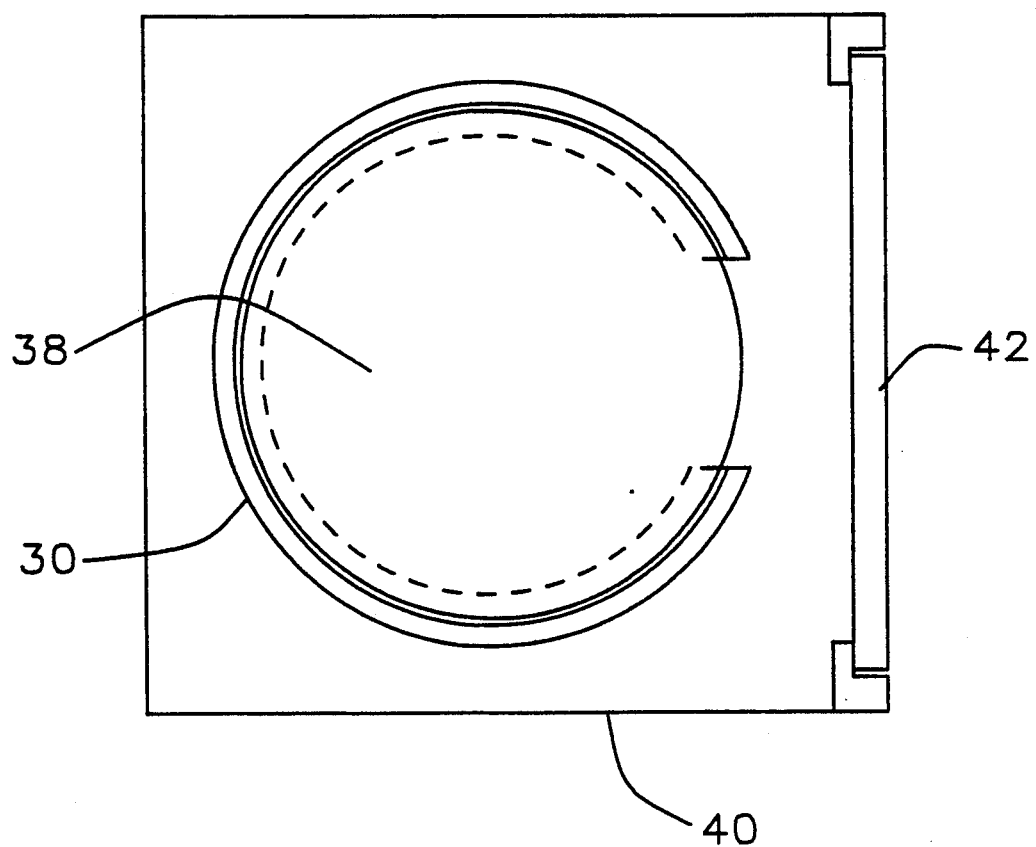
FIG. 3C is a top plan view of FIG. 3B.

An alternative to the aforedescribed process is to provide a box 40, shown in FIGS. 3B and 3C, that is provided with a platform 30 to support wafer 38, also having a radial slot, and a door 42 on one side thereof. In order to transfer the wafer from the box to the canopy, the box 40 is moved into position with door 42 in alignment with door 43 in the wall of the canopy, the doors opened, and the wafer removed by a suitable handling apparatus. The box also has an information storage unit 44 that is capable of holding the entire process sequence of the wafer to be processed. This storage unit 44 may be a microprocessor or microcomputer having sufficient memory capacity. Besides keeping the identity and process sequence for the wafer, the box maintains the wafer in a clean environment.

Transport vehicles 50 are provided for operation on track 20 and the branch tracks 22. The tracks are wide enough to accommodate two way traffic of vehicles 50. The vehicles 50 are preferably guided along the track by a guide tape on the floor. Vehicles 50 have a suitable source of power to move independently of each other.

Figure 5:
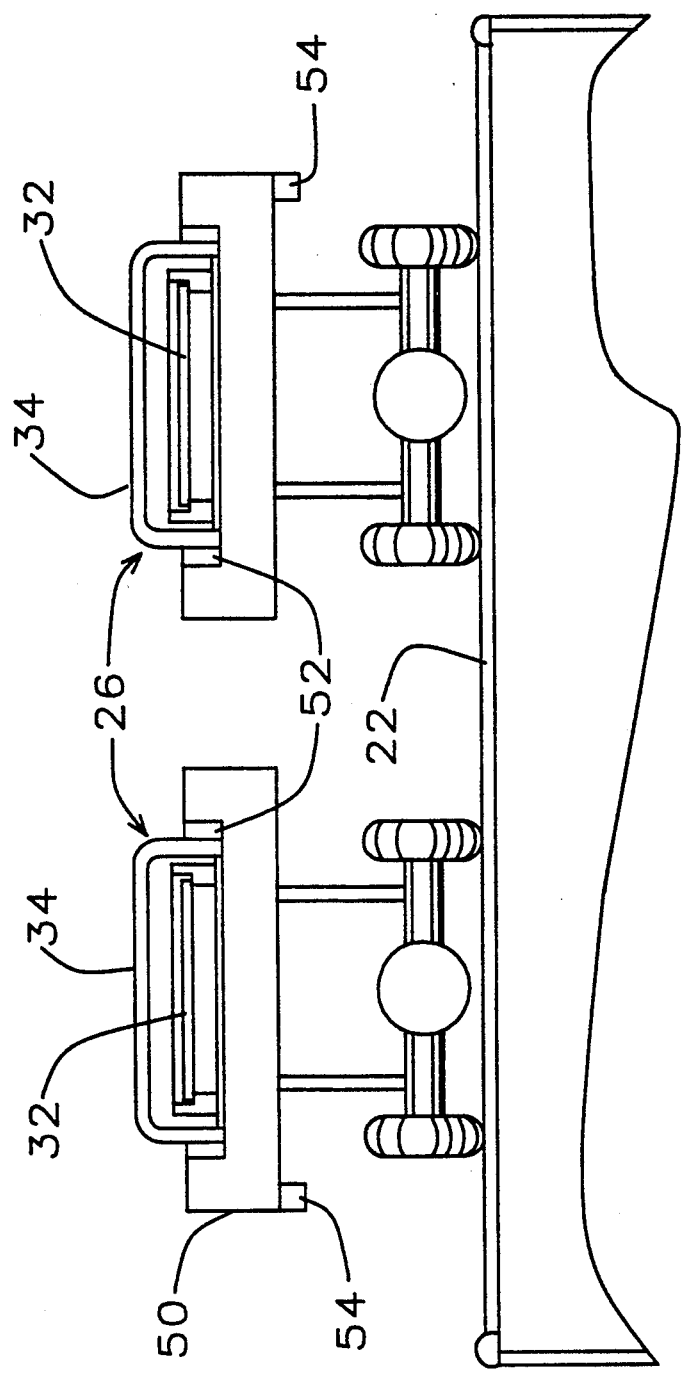
FIG. 5 is a detailed elevational view of a section of the track with a pair of transport vehicles.

The vehicles 50 as shown in FIG. 5, have a platform 52 to support a box 26. The vehicles 50 each have a steering mechanism which allows them to traverse the tunnel and branch tunnels while maintaining an orderly flow of traffic. Other construction features of these vehicles may include an appropriate local power source such as a battery, motor and driving mechanism, microprocessor with memory, bar code reader 54, computer interface of optical or radio techniques.

Figure 2:
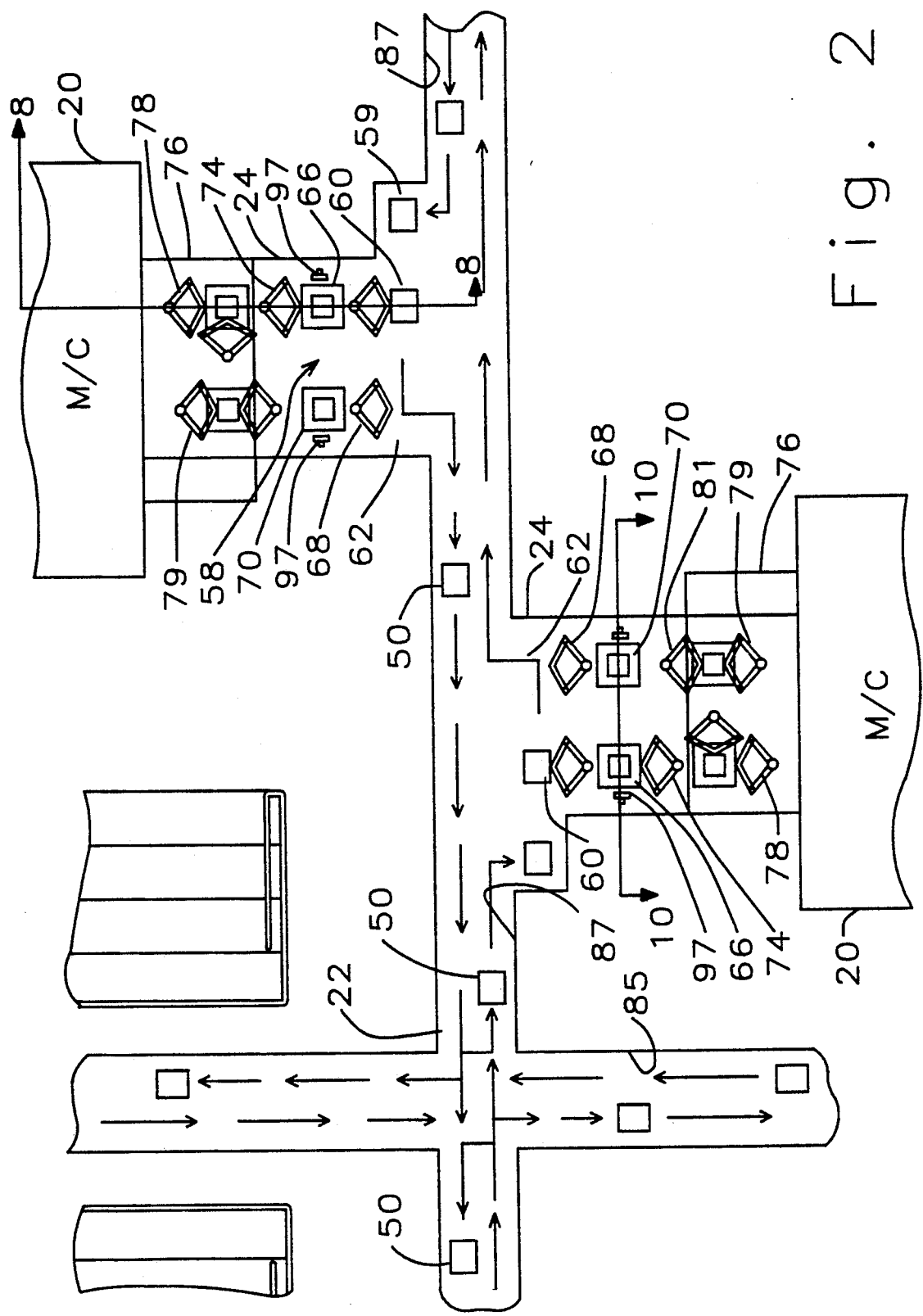
FIG. 2 is a diagrammatic representation in plan view, in greater detail and in larger scale, of a portion of the manufacturing system of the invention.
Figure 8:
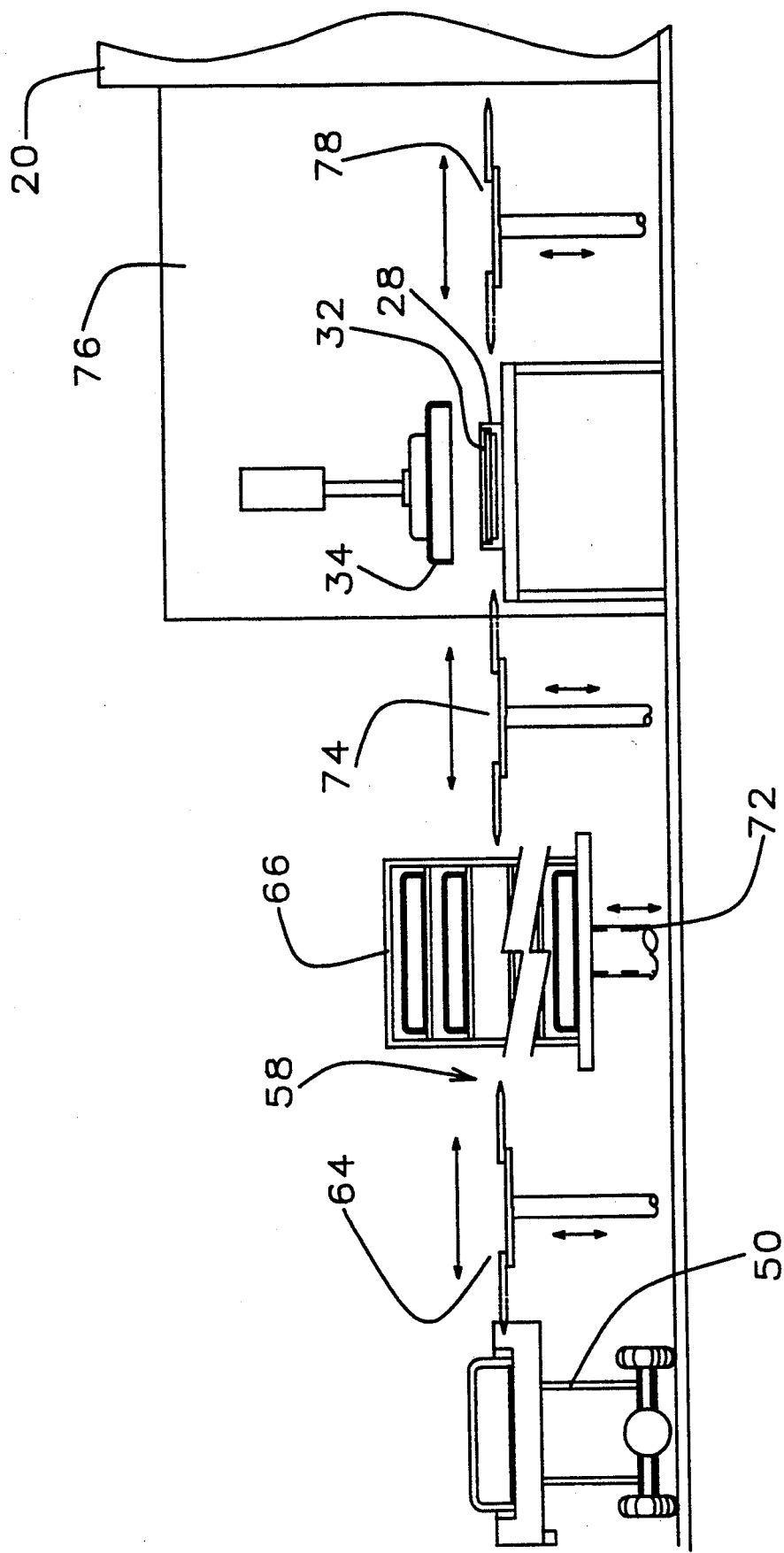
FIG. 8 is an elevational view taken on line 8—8 of FIG. 2.

As seen in FIGS. 2 and 8, at each processing station 20 there is provided a transport vehicle buffer 58 having an unload zone 60, where a vehicle 50 can be parked, off the main tunnel route, and the box can be unloaded for processing at the associated processing station. Buffer 58 also has a load zone 62 where a vehicle 50 can be parked to receive a box from a processing station 20 after the process step on the wafer has been completed. The vehicles 50 can be guided from the tunnel into and out of the buffer zone, as will be explained later.

As shown more clearly in FIG. 2, a wafer carrier handling apparatus 64 is provided to take a box from a transport vehicle parked at the unload zone 60, and to place it in box buffer 66. A box handling apparatus 68 is provided to take a box from box buffer 70 and to place it on a transport vehicle parked at the load zone 62. Box buffers 66 and 70 are preferably adapted to hold a plurality of boxes. A suitable structure is shown in FIG. 8 wherein a plurality of shelves can be moved vertically by a vertically movable shaft 72. A box handling apparatus 74 is provided to remove a box from a box buffer 66. and place it in position for removal of the wafer from the box for processing at the associated processing station 20.

The box, containing a wafer to be processed, is moved into chamber 76 where a clean environment is maintained. Chamber 76 is adjacent to a work station 20. Box 26 enters chamber 76 through either an air lock, (not shown) or a door, (not shown), as explained previously. After the box 26 has entered chamber 76, the cover 34 is lifted from base 28 and the wafer 32 is removed by handler 78 and transferred to a processing apparatus at work station 20. A similar arrangement is provided to remove the wafer from work station 20 and return it in a box to a vehicle at load station 62 as shown in FIG. 2. Handler 79 places the wafer on the box base, handler 80 places the cover 34 over the wafer, the box is removed by handler 81 and placed in box buffer 70. Handler 68 takes the box from box handler 70 and places it on a vehicle at load station 62. Any suitable handling means can be provided for transferring the boxes to the box buffers, and the boxes to the chamber 76. The reading of the process information on each box will later be explained in detail.

Figure 9:
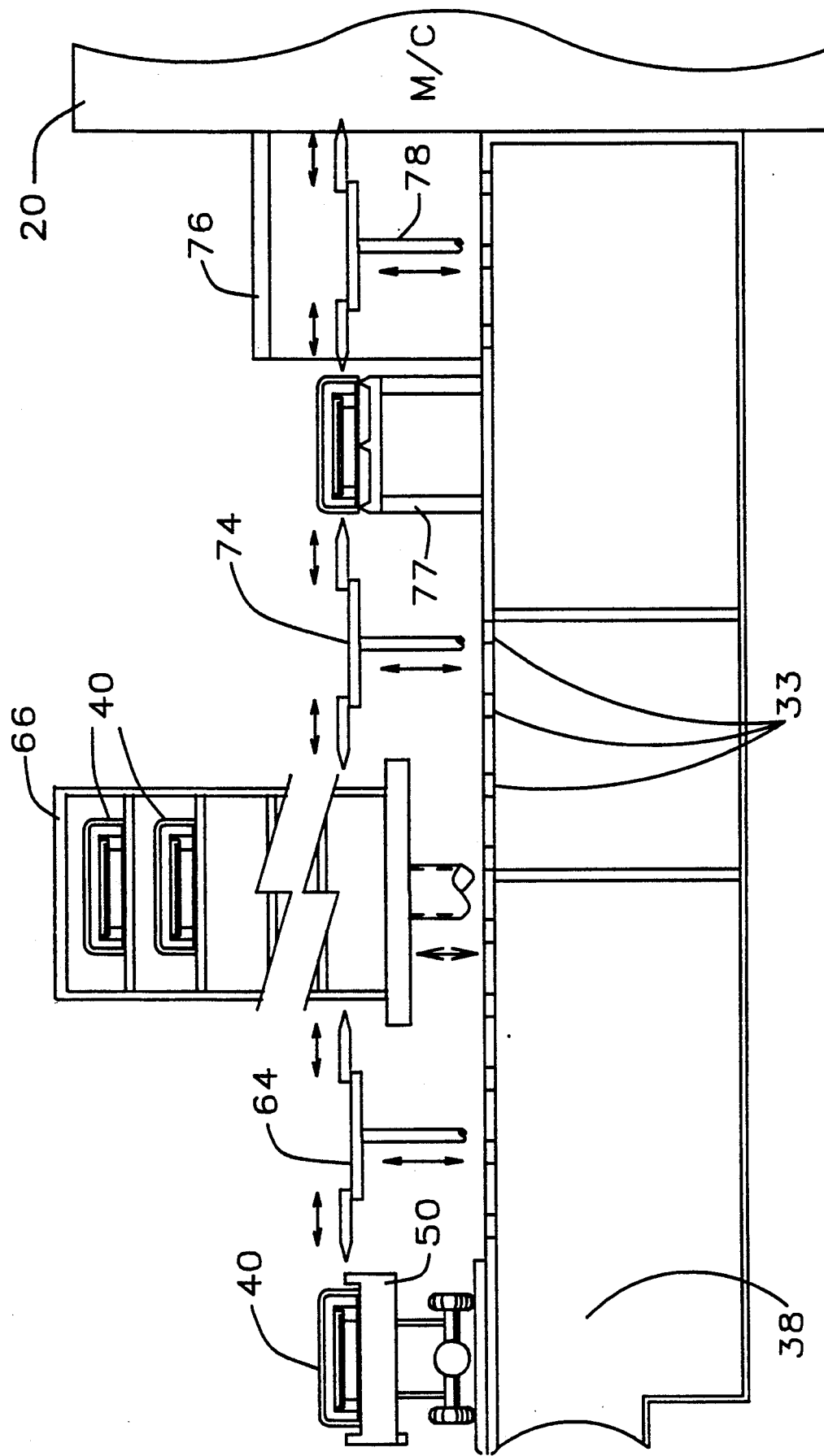
FIG. 9 is an elevational view, showing a preferred embodiment of the loader and unloader interface to transfer wafers and boxes from a transport vehicle and a process apparatus.
Figure 11A:
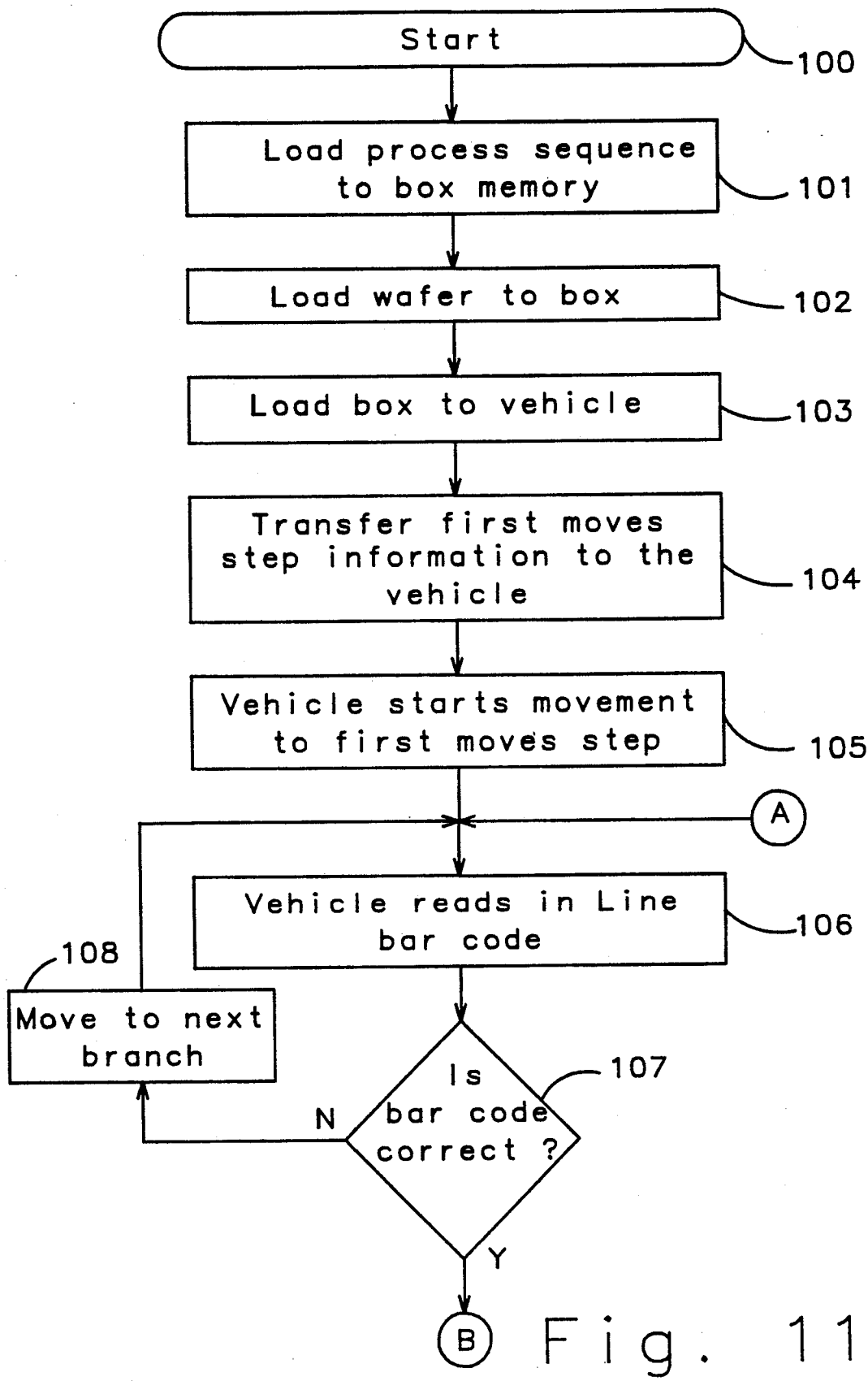
FIG. 11A through 11F is a operational flow diagram of the manufacturing system of the invention.
Figure 11B:
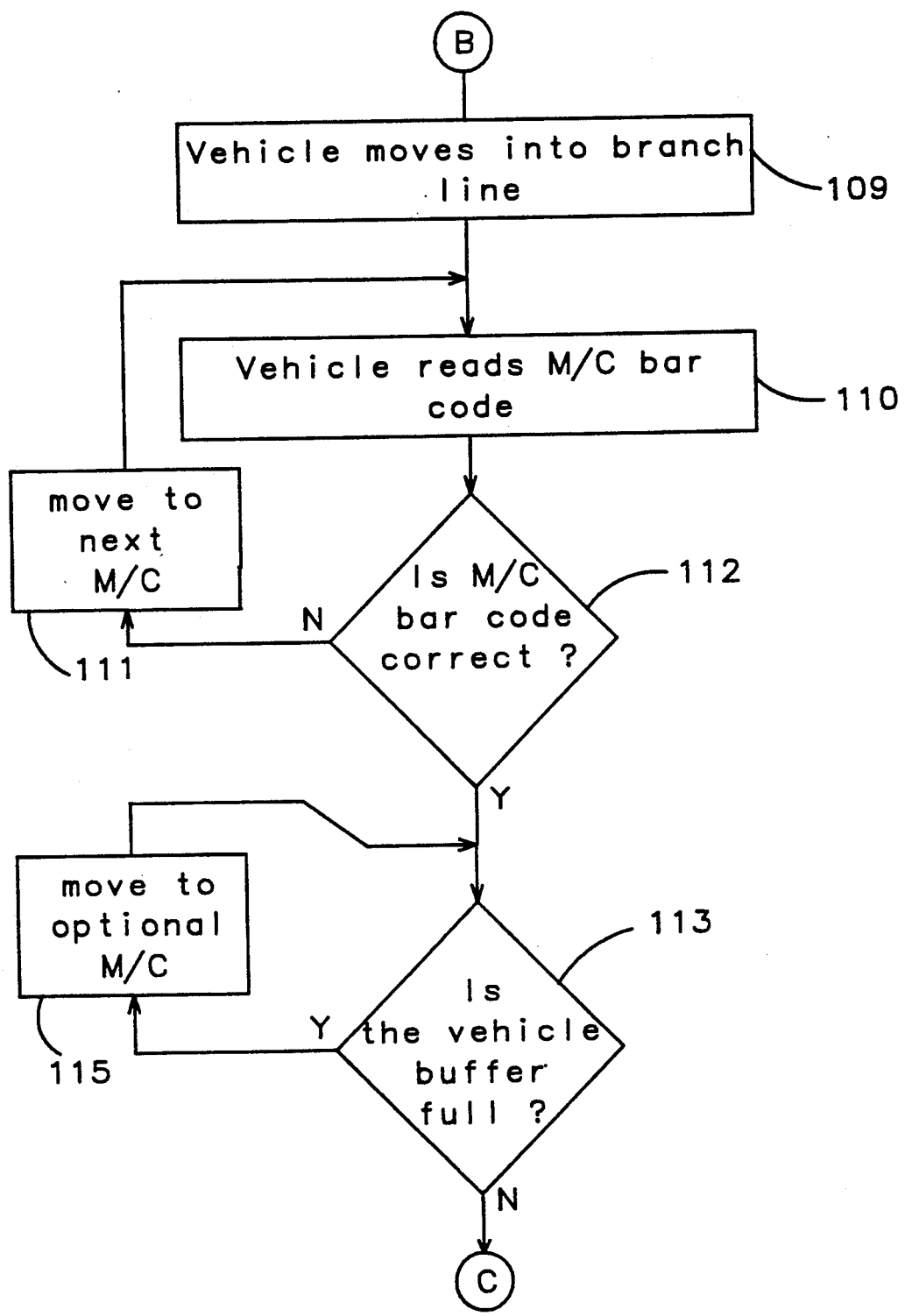
Figure 11C:
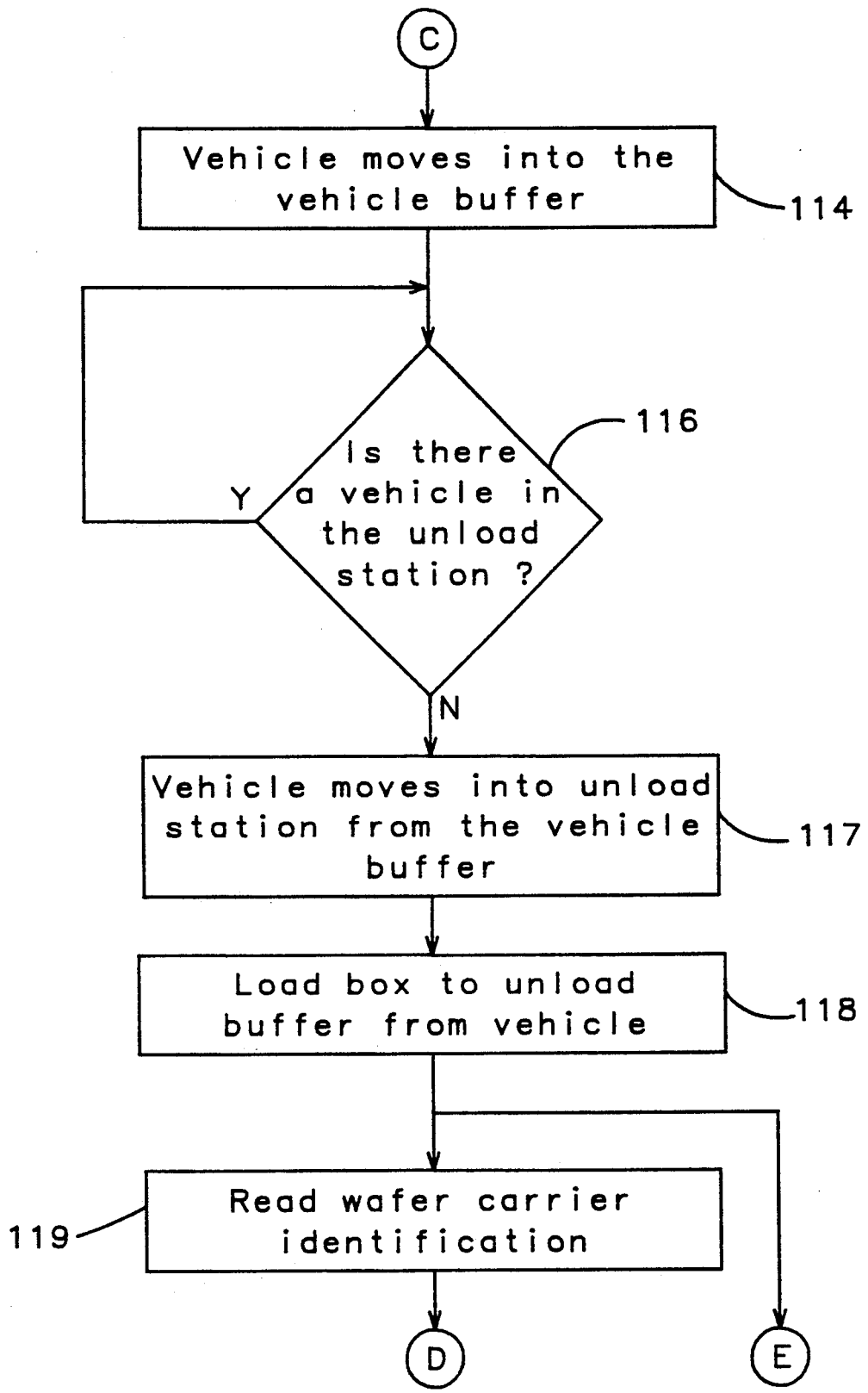
Figure 11D:
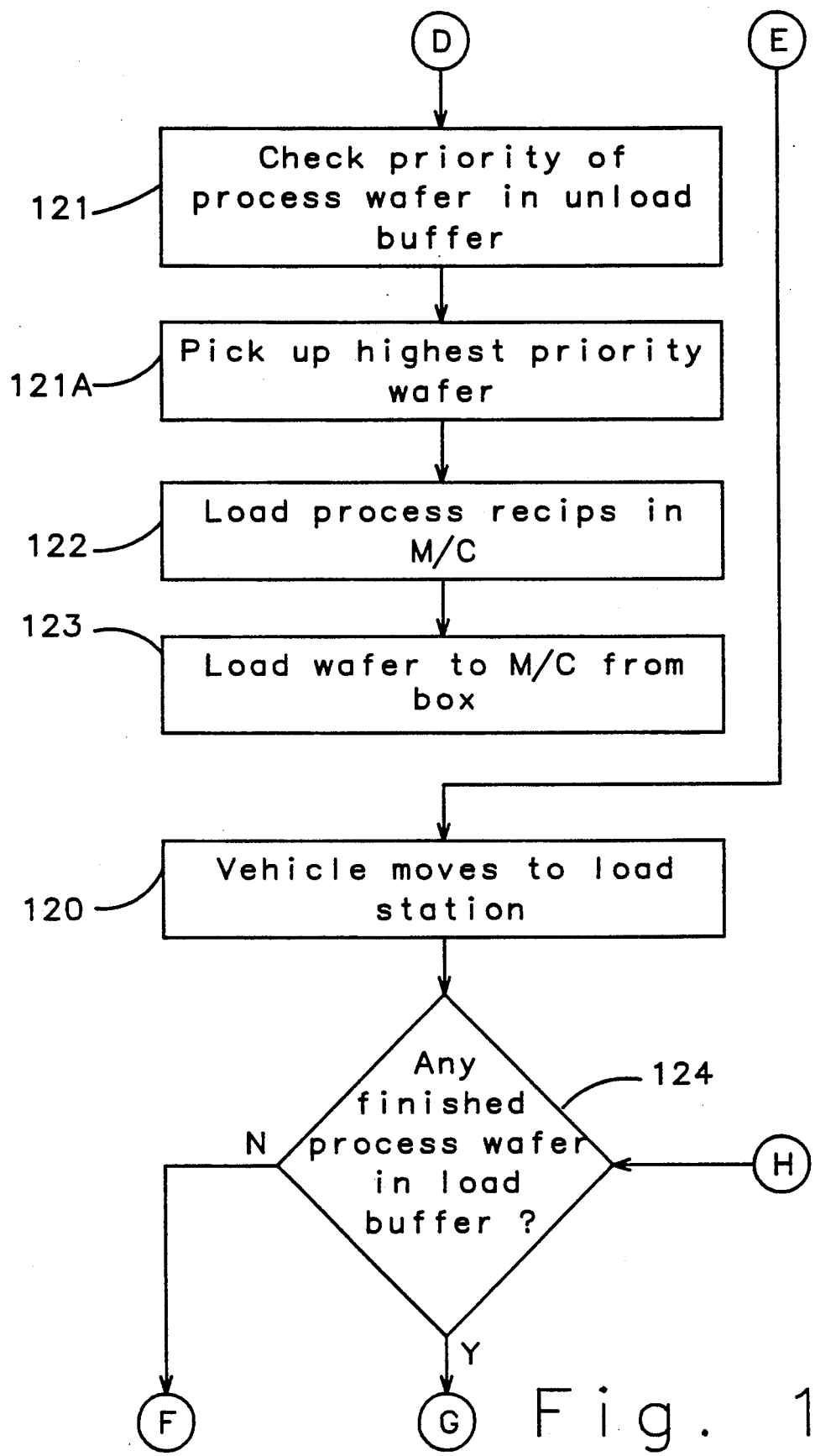
Figure 11E:
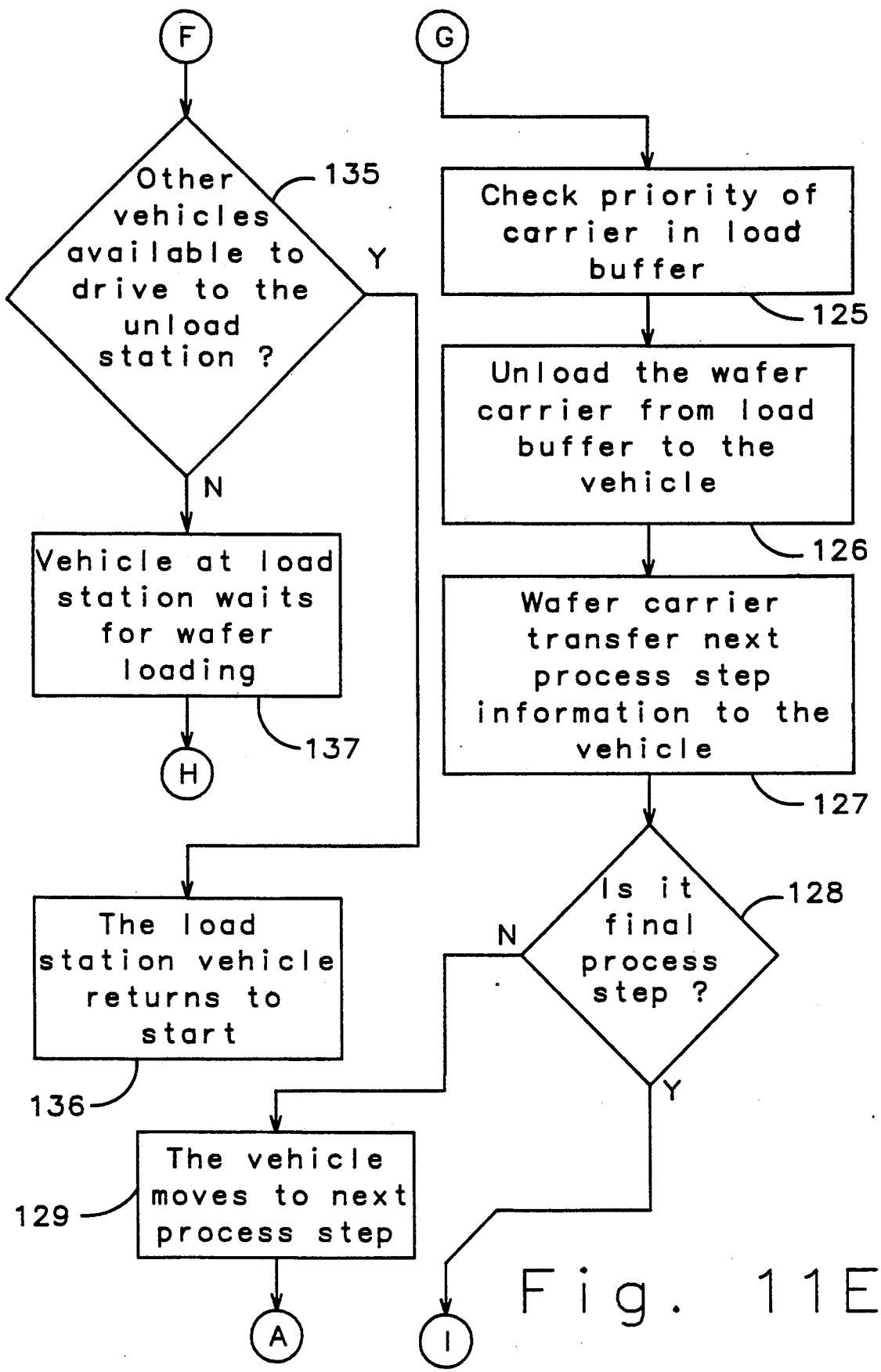
Figure 11F:
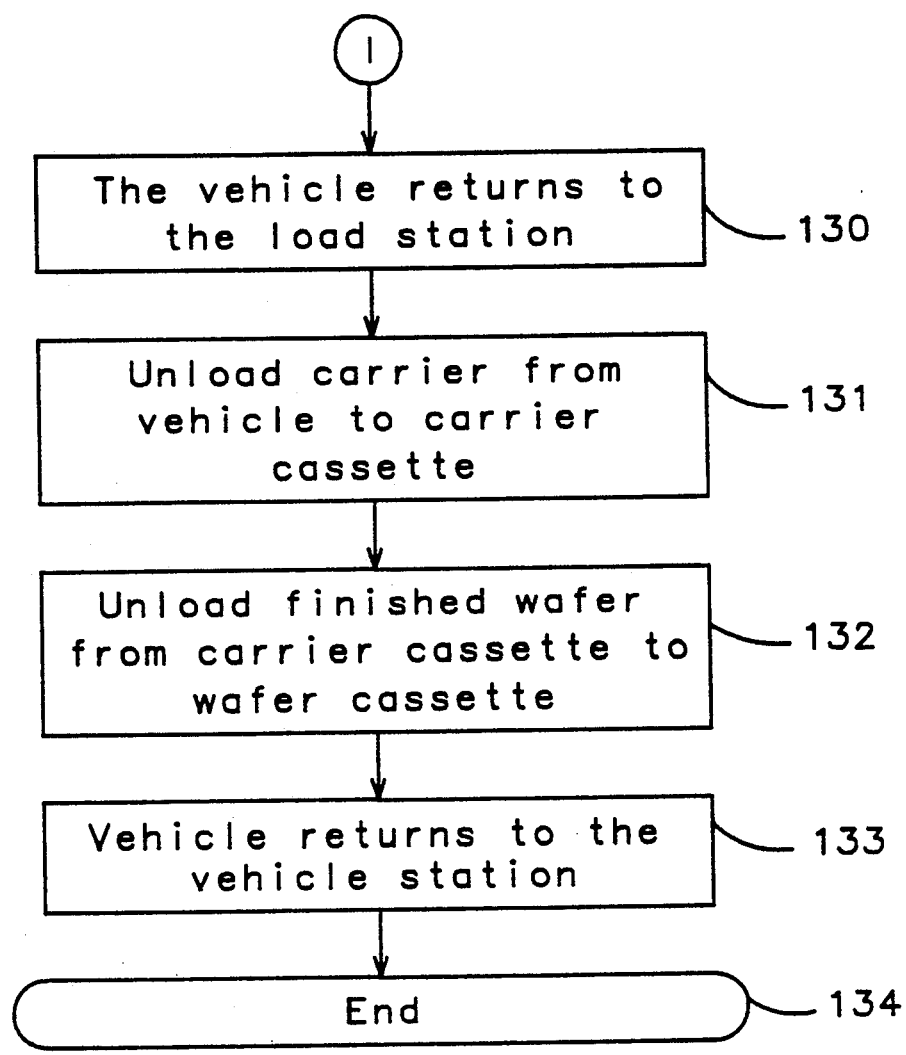

An alternate structure for handling boxes is shown in FIG. 9. Vehicles 50, at unload station 60, are unloaded by handler 64, which loads the box 40 into box buffer 66. Handler 74 removes a box and places it on pedestal 77 with the door of the box up against a door in chamber 76. The doors are opened and handler 78 removes the wafer from the box. The boxes used in the embodiment are shown and described in detail in FIGS. 3B and 3C.

While it is contemplated that near 100% of processing stations will perform operations on single wafers, there are some operations that are better suited to batch operations at least at today's level of technology. These operations are those that consume very long times. This would require many duplicate single wafer machines to replace the batch machine. In a typical 1M SRAM process using 0.8 micron line width, double poly silicon, double metal interconnection and a total of 17 mask steps threre might be 12 steps at the present time that would still be batch operations. These are silicon nitride deposition I, well drive-in after P well ion implantation, silicon nitride deposition II, field oxidation(LOCOS), poly silicon deposition I, poly silicon deposition II, poly silicon doped by $POCl_3$, N+ source/drain ion implant-(high current), P+ source/drain ion implant(high current), poly silicon deposition II-2, poly silicon deposition II-2 ion implant, and plug implant contact plug to source/drain. The first of this group to be replaced with single wafer processing would be the four ion implantation steps. Next, would be the chemical vapor depositions. Then the phosphorous diffusion step will be replaced with single wafer ion implantation. Then, the well drive-in will be replaced with direct implantation and rapid thermal processing. Finally, the LOCOS will be replaced with single wafer trench isolation by reactive ion etching and chemical vapor deposition.

Figure 1B:
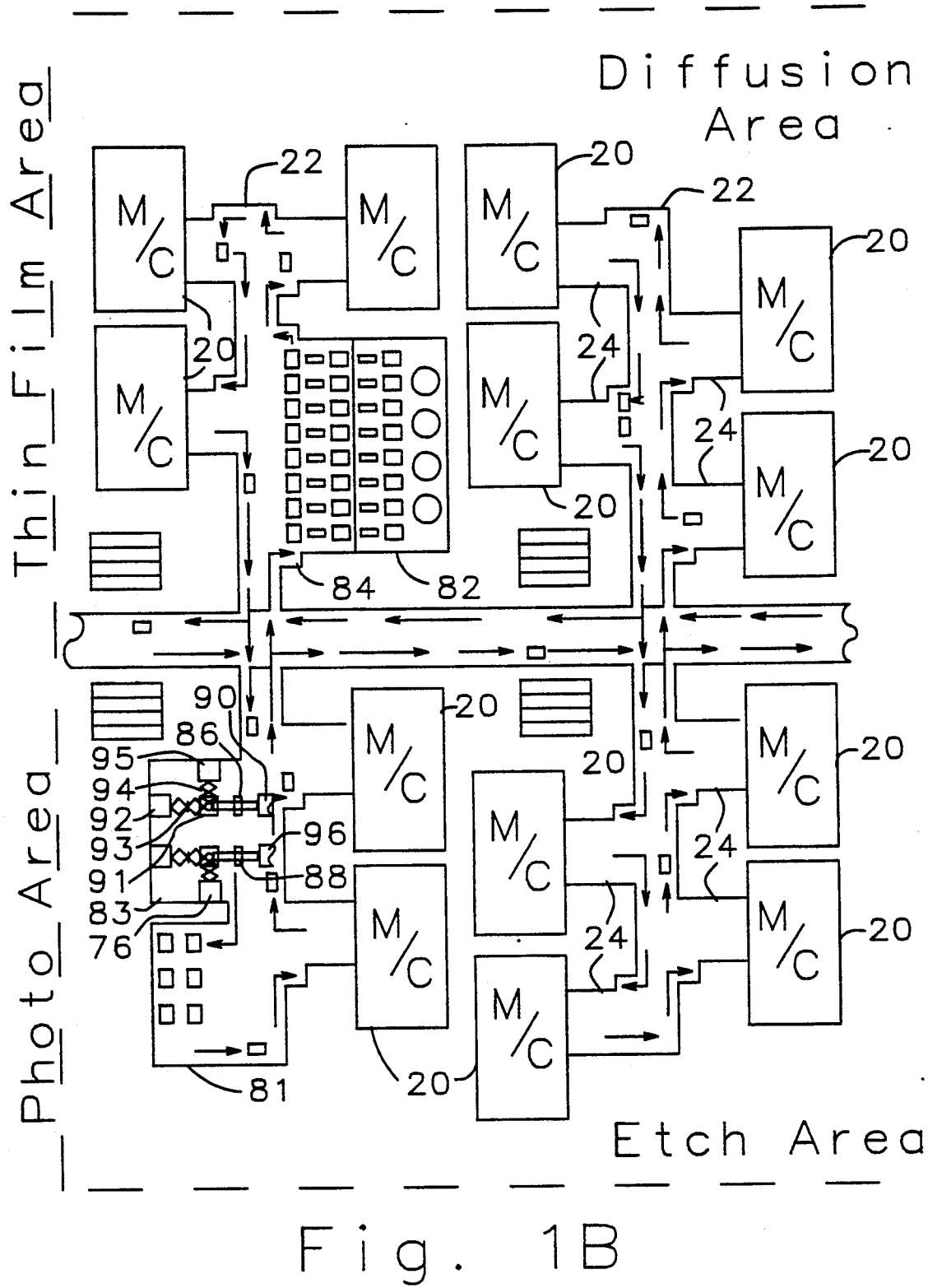

The manufacturing system of the invention can accommodate batch operations in combination with single wafer processing. As shown in FIG. 1B, there is illustrated a processing station 82, which performs a batch operation. A modified vehicle buffer station 84 is provided which has multiple unload and load zones. Each load and unload zone is provided with a box buffer and its associate vehicle and box apparatus. Typically, the location of the unload and load zones will be alternated so that he wafers can be returned to their respective boxes upon completion of the process operation.

The manufacturing system requires a system for directing and controlling the movement of the transport vehicles 50 on track 22 and the branches 24 of the track. In operation, the vehicle 50 will deliver boxes, each containing a semiconductor wafer, to the various processing stations, in the order called for by the process sequence stored in the information storage 44 on boxes 26 and 40. When all of the process steps are completed, the vehicle will deliver the box and wafer to vehicle station 83 where the wafer carrier and wafer are unloaded.

Suitable indications, readable by an interface on the vehicle, are provided on the track 22, such as a support at each track branch, and also adjacent each process machine. A preferred indicator is a bar code marking, as is well known in the art. This is placed ahead of each branch. As indicated in FIG. 2, an additional bar code marking 87 is located ahead of each process station. Marking 85 would indicate the various process stations on each track branch, and marking 87 would indicate the specific process station. A suitable interface 54 is provided on the vehicle to read the various markings.

The vehicle is also provided with another interface to read the process sequence stored in the information storage 44 on box 26 or 40. When a box is received by the vehicle 50 at a load station 62, the information in the information storage 44 is transferred to a computer, such as a microprocessor on the vehicle, or a central computer in communication with the vehicle. This information will include the next required process step. The vehicle will then leave the unload station and proceed into the track branch and on to the track. When the vehicle passes a branch that has the required process station, as indicated by the bar code 85, it will be directed into the branch, that is the vehicle will turn off the guide tape on the floor of the track and follow the guide tape on the floor of the track branch. When the proper process station 20 is approached, as indicated by bar code 87, the vehicle will turn off the guide tape on the branch floor and follow the guide tape leading to the vehicle buffer station 59 and unload station 60.

Figure 6:
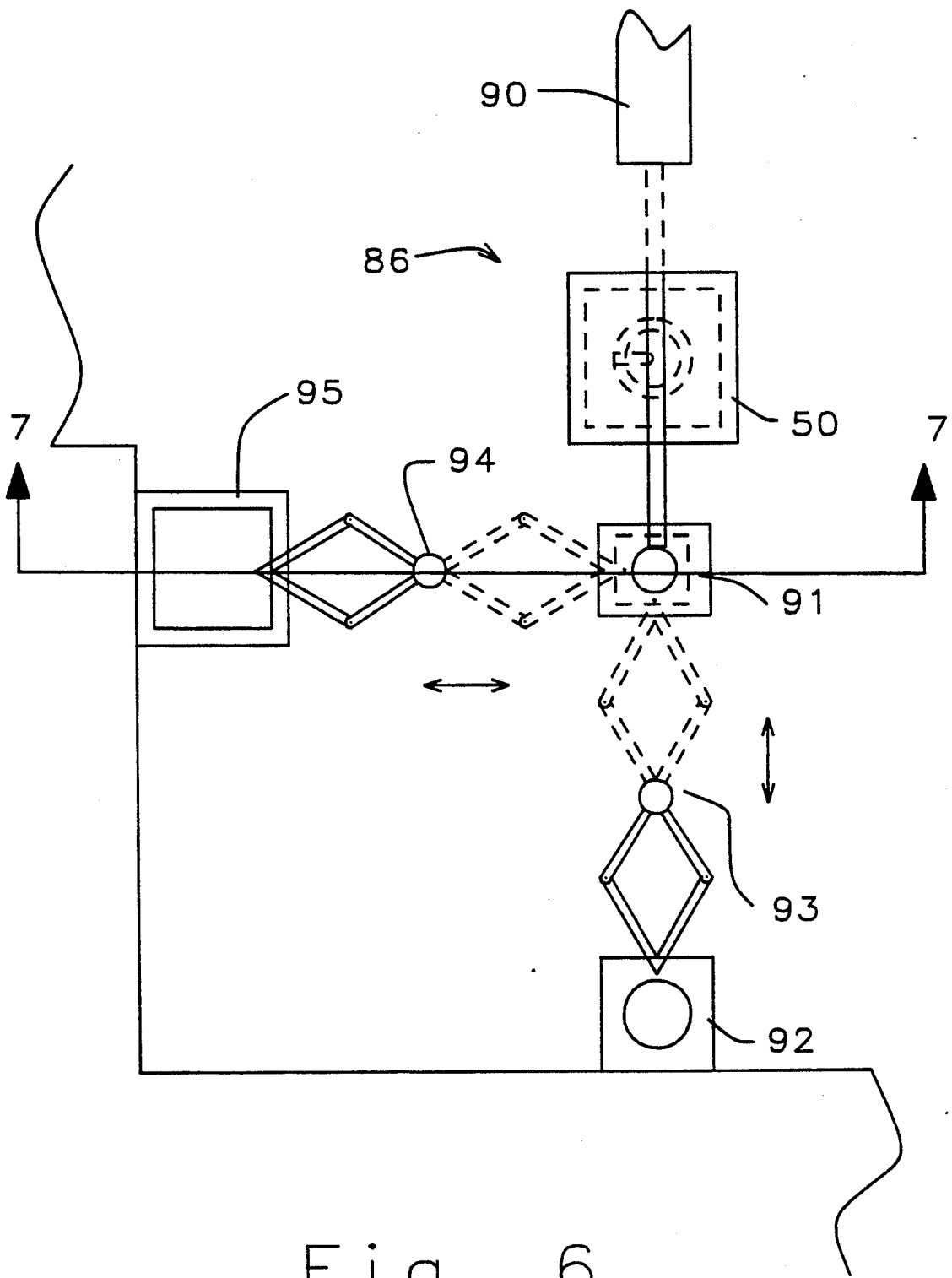
FIG. 6 is a top plan view of the apparatus used to load wafers into boxes, in preparation for processing.
Figure 7:
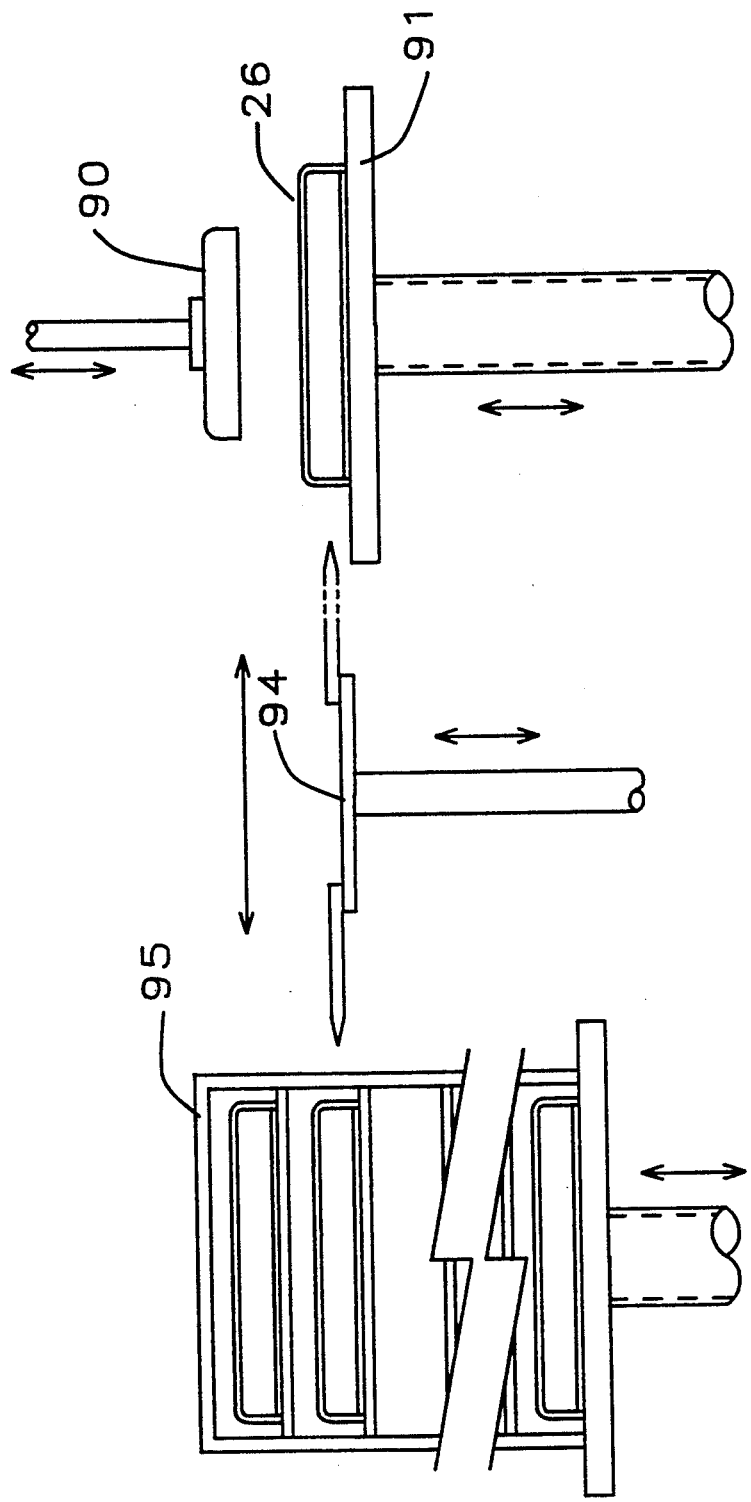
FIG. 7 is an elevational view taken on line 7—7 of FIG. 6.

While at this station or another process station, another box and wafer will be loaded on the vehicle. The process sequence of the new box will be obtained and the process will repeat itself. If the process sequence is completed on the box picked up by the vehicle, the vehicle will pass all the process stations and return to the vehicle station 83. Vehicle station 83 as shown in FIGS. 1, 6 and 7, has an unload zone 86 and a load zone 88. At the unload zone and the load zone there is provided a vehicle buffer zone where the vehicle can park off the main traffic pattern, in a position to be unloaded or loaded. A suitable handler 90 will unload the boxes to a box station 91 and remove the cover. A handler 93 will remove the wafer and place it in the wafer tray 92. Handler 90 will then replace the cover on the box and handler 94 will place the empty box in box handler 95. At the load zone 88, there is provided a suitable handler 96 that is capable of loading boxes and lifting covers. At zone 88 wafers are placed in boxes in preparation for processing, and the boxes are loaded on vehicles waiting at the load station. Adjacent to the load and unload zones 86 and 88, there is a vehicle parking zone 81 where surplus vehicles can be stored until needed.

At each process station, as shown in FIG. 2, there is provided an interface 97 capable of reading the information storage memory 44 on boxes 26 or 40, while on buffers 66 and 70. Interface 97 determines the process required to be performed on the wafer, and also any specific process details and the wafer priority. Interface 97 and adjacent buffer 70 are capable of altering the storage 44 by indicating that the process performed at the process station has been completed.

The handling apparatus 64, 68, 66 and 70 at the processing stations 20, and also at the vehicle stations can be any suitable mechanisms that are provided with suitable gripping means to handle boxes, depending on the operation required. Typically, the handlers 78 and 79, are robots provided with a vacuum griping means for handling the wafer. The slot 38 in the boxes 26 and 40 is provided to facilitate handling the wafer. An elongated vacuum tube can be inserted beneath the wafer 38 and the wafer lighted from the box base 30. The slot may also be used by a suitable gripping element to engage the tray.

Referring now to FIGS. 11A through 11F, a flow diagram is presented to better explain a preferred mode of operation of the manufacturing system of the invention. The start operation, indicated as block 100, occurs at the vehicle station 83. As indicated by block 101, the process sequence for a semiconductor wafer is loaded into the information storage 62 of a box 26 or 40. At block 102, the semiconductor wafer is loaded in the box. At block 103, the box is loaded on the carrier vehicle. The necessary process sequence is transferred to the computer on the vehicle. The process sequence determines the first process station as indicated by block 104. The vehicle at block 105 now leaves the vehicle station and begins its trip circuit.

When the vehicle senses the bar code 85 on the track surface, such as the wall, adjacent a track branch with its interface sensor 54 at block 106, a decision is made at block 107. If the bar code indicates that the proper processing station is located on the track branch, the vehicle follows the guide tape into the track branch 24, as in block 109. However, if the branch track 24 does not have the needed processing station, the vehicle continues on down the track, following the guide tape to the next branch, as in block 108.

In the track branch the vehicle reads the first bar code identifying the processing station adjacent thereto at block 110 and a decision is made at block 112. If the processing station is the proper one called for in the process sequence, a second decision is made, that is whether or not the vehicle buffer 59 is full as at block 113. If the vehicle buffer 59 is open, the vehicle moves in as at 114. If the vehicle buffer is occupied, the vehicle moves onto an optional processing station as at block 115. This optional processing station is normally but not necessarily in the same branch track.

Another decision, block 116 is made whether or not there is a transport vehicle in the unload station 66. If the unload station is open, the vehicle moves into unload station 66 as indicated by block 117. The box 26 or 40 is transferred to the box buffer 66 at block 118. If the unload station is occupied, the vehicle 50 waits its turn in the vehicle buffer 64.

After the vehicle is unloaded, it moves to the load station 62 as in block 120. At the box 70, an interface 97 checks the box identification as in block 119. The priority of the wafer is checked at block 121. The highest priority wafer is picked up in the buffer and sent to machine as shown in block 121A. The process sequence of that wafer is loaded from the information storage 54 into the processing apparatus at the processing station at block 122. The box is then removed from the carrier and placed in the process apparatus at block 123. Returning to the transport vehicle as it moves from the unload station 60 to the load station 62, at block 120, a decision is made at block 124, that is whether or not there are any boxes in the load buffer 70 as in block 124. If there are boxes, interface 97 checks the priority of the wafer at block 125. The boxer carrier is transferred from the buffer 70 to the vehicle at block 126 and the process sequence in the box storage 44 is transferred to the vehicle computer at block 127.

A decision is made at block 128 as to whether or not the process step performed at the processing station was the final step in the process sequence. If the process step was not the final one, the vehicle moves to the next processing station called for in the process sequence, repeating the blocks 106, 107, 108, 109, 110, 111, 112, 113, 114 and 115.

If the process step is the last one called for in the process sequence, the vehicle by-passes all the processing stations and returns to unload zone 86 in the vehicle station 83 as in block 130. The box is then transferred from the vehicle to the pedestal 91 at block 131. The box is opened and the finished wafer is removed by handler 93 to wafer loader 92. Handler 94 stores the empty box in buffer 95. The vehicle than returns to zone 96 at block 133 and thus ends the process sequence at block 134.

Returning now to decision block 124, when there are no unfinished wafers in the load buffer 76, a check will be made whether or not there are other vehicles available to pick up wafers from station at block 135. If there are other vehicles available in the immediate area, the vehicle returns to the vehicle zone 84 at block 136. If there are no vehicles available, the vehicle will remain at the load station 68 as in block 137.

Figure 12:
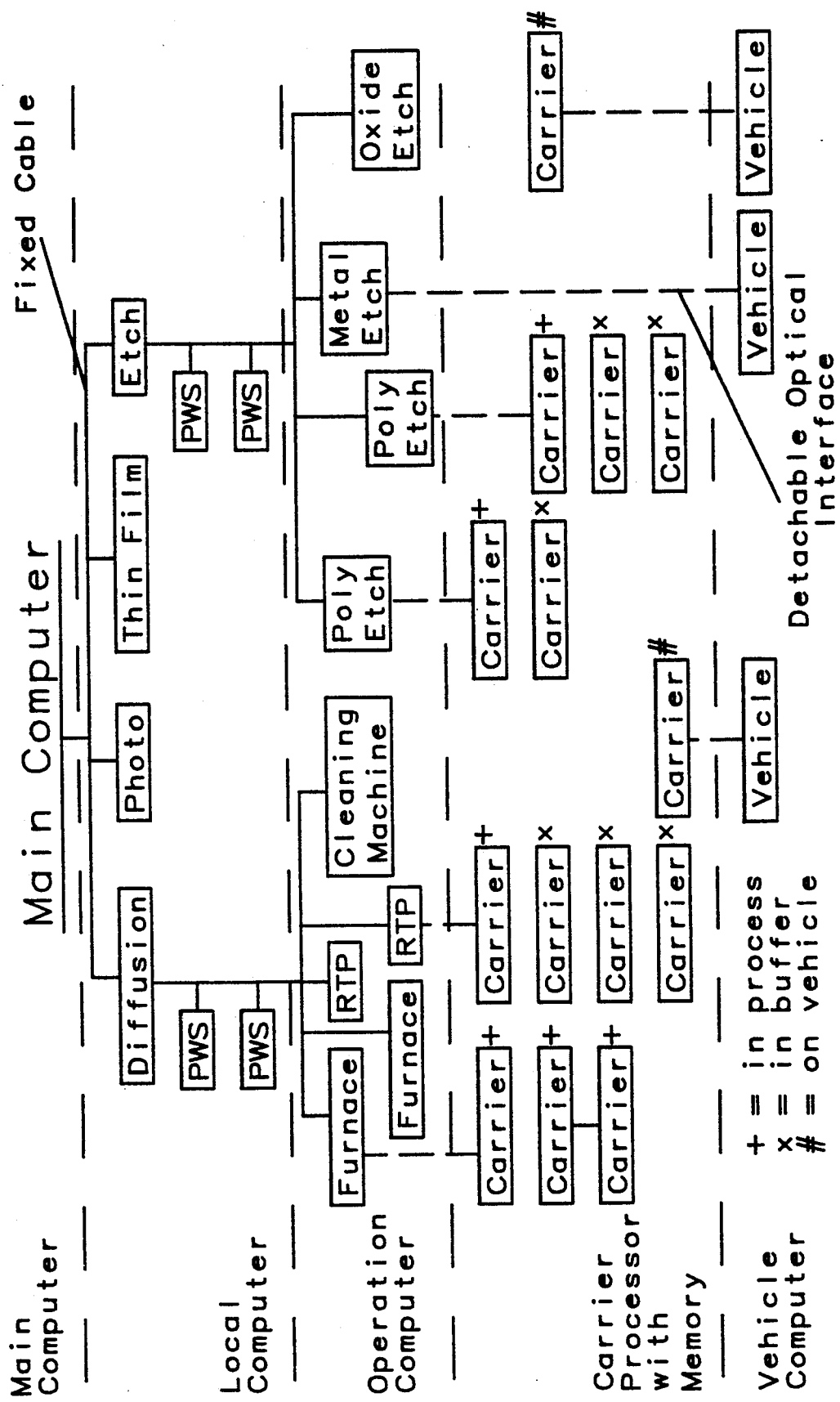
FIG. 12 schematically illustrates the computer arrangement and their connections necessary to operate the present system and method.

Referring now more particularly to FIG. 12, the computer organization of the single wafer manufacturing system and method can be understood. There is one Main Computer for each FAB or manufacturing line. Its functions are (1) auditing the wafer status in the FAB by area work in process (WIP) control and (2) arranging schedules, priority send instructions to local and operation computers. The Local Computer is located in and with each operation area, that is Diffusion, Photo, Thin Film and Etch. Its functions are (1) monitoring status of each operation steps, (2) auditing the wafer status in each operation area by operation WIP control, and (3) statistical analysis of production and quality data. The Personal Work stations (PWS) are equipped with each engineering staff member of each operation area. Its function is the major human interface to all computers, and to work as a stand alone personal computer. The Operation Computer is equipped with each operation step. Its functions are (1) to control each load/unload buffer, robot arm and to manage the inventory wafers in the buffers and (2) record status of each operation process and equipment and store all the detailed parameters. The Carrier Processor is equipped with each wafer carrier. Its functions are to (1) contain process sequence and process status parameter of the specific wafer and (2) be capable of accepting instructions for changes of sequence or recipes. The Vehicle Computer is equipped with each vehicle. Its functions are (1) directing the destination of each vehicle and (2) be capable of accepting instruction of destination from Carrier Processor or Operation Computer. Note that on the FIG. 12 the symbols +, x and # refer to the location of the wafer designated to the box or carrier to be in process, in buffer and on vehicle, respectively.

There may be a problem of too many vehicles/wafers in the system. The solution to this problem is to either (1) use a multilayer track, that is more than one track above one another or (2) have multilanes in the single track. With the multilayer track there is a problem with the traffic control.

The manufacturing system of the invention is adapted to process single wafers (or batch wafers) with single wafer transfer, as contrasted with batch wafer transferring, as is widely practiced by the prior art. Any wafer in the system can advance to the next processing step as shown as it finishes the current step. Unlike batch cassette transfer processing, a wafer having finished its process does not have to wait in a cassette until the whole lot is finished to move to the next processing station for the next process step to begin. This single wafer transfer reduces the inventory of wafers tied up in processing, thereby reducing inventory costs, and storage costs. Smaller numbers of similar type devices can be processed at cost effective rates, and there is a shorter turn-about time which results in a faster response to customer requirements. This also reduces the risks due to production problems and/or market variations. Fast process and product development time is very important advantage of this new single wafer processing and single wafer transfer system and method.

Yield improvements are realized because (1) with the carrier there is no movement of abrasion happening above wafers as in the batch type cassette transfer systems, thusly reducing defects, (2) very short queuing time reduces chance of getting unwanted particles on the wafers, and (3) isolation from humans.

The difference between this system, and the system disclosed and claimed in Ser. No. 07/628 437, filed Dec. 17, 1990, is that the transport vehicles do not operate in a tunnel, but rather on an open track. Wafer cleanliness is assured by providing a sealed box that contains a single wafer. Suitable interfaces are provided for introducing the wafer into the canopies surrounding the processing apparatus which contain a very clean environment.

With the present manufacturing system, the capitol investment required for a track is less than that required of a tunnel. Further, the track is easier to construct and maintain, and to modify and rearrange in the event that process apparatus are added or removed to the line. Still further, no air handling equipment such as blowers, ducts, filters, etc. are needed with the track system.

The optimum single wafer transfer FAB cycle time was simulated for a 1M SRAM process using 0.8 microns line width, double polysilicon, double metal interconnection and total of 17 layer mask steps. The comparison of cycle time between traditional cassette transfer process and single wafer transfer process is as per the following table:

|  | Ideal Cycle Time | Normal Cycle Time |
| --- | --- | --- |
| Single wafer transfer | 2.5 days | 11.2 days |
| Cassette transfer | 14.1 days | 63.6 days |

The Single Wafer process included all single wafer processing except 12 steps which at this time are still batched. These include 4 high current implant steps, 5 LPCVD steps and 3 furnace steps. These 12 steps take 2.1 days of operation time and consume 88% of ideal cycle time of single wafer transfer process. The Ideal Cycle Time for single wafers (or cassette in Cassette Transfer process) have not delay. When they arrive at each step, they can be put into operation immediately. The Normal Cycle Time is obtained by multiplying Ideal Cycle Time by 4.5. It means after each single wafer (or cassette) reaches the process step, it has to wait 3.5 wafers (or cassettes) to finish the operation before it starts the next operation. According to our experience and referring to other FABs this is a reasonable number for Normal Cycle Time. The Transfer Time is assumed to be 5 minutes on average. This process contains 137 transfers, so the total transfer time is half a day. This number is negligible unless the cycle time is very short. It is not included in the numbers shown in the table. These simulated results in the Table shown the clear advantage of the new system and method of single wafer transfer.

While the invention has been particularly shown and described with reference to a preferred embodiment thereof, it will be understood by those skilled in the art that changes in form and detail may be made therein without departing from the spirit and scope of the invention.

What is claimed is:

1. A manufacturing system for individually handling and processing semiconductor wafers through a plurality of processing stations that perform operations on the wafers comprising:
   a plurality of processing stations, each of said stations capable of performing at least one processing operation in a controlled environment on a semiconductor wafer;

a canopy enclosing each of said processing stations to maintain a controlled environment within;

a plurality of sealable boxes for enclosing a single wafer;

a branched track providing a support surface leading to each of said processing stations;

a plurality of guided transport vehicles for carrying said sealable boxes, each adapted to operate on said branched track and move on said support surface, to any of said processing stations associated with said branched track;

a transfer interface associated with each processing station adapted to preserve a controlled environment within said canopy and about the wafer as it is transferred from said box to within said canopy;

each of said processing stations provided with a transport vehicle buffer having an unload zone and a load zone;

a box load buffer;

a first box handling means adapted to transfer boxes between a transport vehicle at said transport vehicle buffer and said box load buffer;

a second box handling means to move boxes between said box load buffer and said transfer interface;

a means to associated with said transfer interface to move wafers from each box to processing apparatus within said canopy;

a memory storage means on each of said boxes capable of holding the desired wafer process sequence for the wafer associated with said box with the capability of updating the sequence for processing operations completed;

a means for directing said guided transport vehicle to move boxes sequentially to each processing station in accordance with the wafer process sequence stored in each of said memory storage means on said boxes;

a vehicle station having a box loading and unloading area where wafers to be processed are introduced into the system, and where wafers that have been processed are removed from the system.

2. The manufacturing system of claim 1 wherein said branched track has a width that is suitable for two-way traffic of transport vehicles.

3. The manufacturing system of claim 2 wherein tape is provided on said surface of said branched track to maintain orderly lines of transport vehicle traffic.

4. The manufacturing system of claim 1 wherein each of said guided transport vehicles is provided with a platform for receiving and holding during transport, a single box and its associated semiconductor wafer.

5. The manufacturing system of claim 3 wherein each of said transport vehicle buffers includes a surface adjacent to and accessible to said branched track of a size to accommodate at least one transport vehicle.

6. The manufacturing system of claim 5 wherein guide tape is provided in said vehicle buffer with branches of the guide tape on said branched track to each of said vehicle unload zones and said vehicle load zone.

7. The manufacturing system of claim 6 wherein said transfer interface is located adjacent to and accessible to said vehicle buffer.

8. The manufacturing system of claim 7 wherein said box load buffer includes at least one vertically movable stage provided with a plurality of platforms to receive and temporarily store a plurality of boxes.

9. The manufacturing system of claim 7 wherein said box load buffer includes a first storage means to store boxes received from a transport vehicle at the unload zone, and a second storage means to store boxes received from a processing station prior to loading onto a transport vehicle at the vehicle load zone.

10. The manufacturing system of claim 9 wherein said box load buffer further includes robots to transfer boxes to and from said transfer interface.

11. The manufacturing system of claim 1 wherein said means for directing guided transport vehicles includes an interface to read said memory storage on a box, distinct identifying machine readable indicia adjacent said branched track that identifies the locations of processing stations, a sensor interface on said transport vehicle to read said identifying indicia, a computer means to (1) determine from said process sequence information in said memory storage on said box the required next process step, and (2) means to direct the transport vehicle to the required process station capable of performing the required process step in response to the said identifying indicia adjacent said branched track.

12. The manufacturing system of claim 11 wherein said identifying machine readable indicia is a bar code.

13. The manufacturing system of claim 12 wherein said identifying machine readable indicia includes bar code adjacent to each branch of said branched track that indicates the various types of process stations associated with each branch, and specific bar code within each branch adjacent each process station to indicate the location of the process station.

14. The manufacturing system of claim 13 wherein said computer means includes a means to selectively direct the transport vehicle to follow said guide tape that leads into a branch of the tunnel when the desired processing station is located off a branch of said branched track.

15. The manufacturing system of claim 14 wherein said computer means has means to selectively direct the vehicle to follow the guide tape that leads to a buffer station associated with the processing station called for by the process sequence in said memory storage of said wafer carrier.

16. The manufacturing system of claim 11 wherein said computer means has means to direct said transport vehicle to said vehicle station upon completion of the process steps in said process sequence in said memory storage of the box carried by said transport vehicle.

17. The manufacturing system of claim 1 wherein said wherein said sealable boxes each include (1) a base, (2) a platform on said base for supporting a wafer, (3) a cover that mates with said base to form an enclosure, and (4) a means to secure said cover to said base.

18. The manufacturing system of claim 17 wherein said sealable box further includes a surface on said platform that engages the peripheral surface portion of a semiconductor wafer, and a radial slot in said platform to provide access to the bottom surface of the wafer.

19. The manufacturing system of claim 1 wherein said transfer interface includes a chamber joined to said canopy, a first entry door for admitting a box into said chamber, and a second door between said chamber and said canopy.

20. A manufacturing system for individually handling and processing semiconductor wafers through a plurality of processing stations that perform operations on the wafers in accordance with a process sequence comprising:

a plurality of processing stations;

canopy means, each provided with an opening over each processing station;

means to provide a controlled environment within said canopy;

a plurality of sealable boxes, each adapted to enclose a single semiconductor wafer;

a branched open track providing a platform leading to each processing station;

a plurality of guidable transport vehicles adapted to operate in said track, each vehicle adapted to support and move a single box;

transfer interfaces at each processing station, each adapted to transfer a semiconductor wafer from a box on a vehicle to the interior of a canopy through said opening;

a means to direct transport vehicle in response to a process sequence to various processing stations;

a means to maintain a record of process operations performed each wafer;

a means to automatically remove wafers from the system that have completed a process sequence.

21. The manufacturing system of claim 20 wherein said transfer interface includes first handling means to transfer a box from a vehicle to and through an opening to the interior of said canopy.

22. The manufacturing system of claim 20 wherein said boxes each are provided with a door, said canopies are each provided with a door, said transfer interface includes a first handling means to move the box into contact with said canopy with the doors of the box and canopy in alignment, a means to open the doors, and second handling means to remove the wafer from the box to the interior of said canopy.

23. The manufacturing system of claim 21 wherein said box includes a cover, said transfer interface includes a second handling means within said canopy to lift off the cover and remove the wafer for processing.

24. The manufacturing system of claim 22 wherein said opening is an air lock.

* * * * *